(12) United States Patent
Sandhu et al.

(10) Patent No.: US 7,919,386 B2
(45) Date of Patent: Apr. 5, 2011

(54) METHODS OF FORMING PLURALITIES OF CAPACITORS

(75) Inventors: Gurtej S. Sandhu, Boise, ID (US); D. Mark Durcan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 12/430,621

(22) Filed: Apr. 27, 2009

(65) Prior Publication Data

US 2009/0209080 A1    Aug. 20, 2009

Related U.S. Application Data

(63) Continuation of application No. 11/083,489, filed on Mar. 18, 2005, now Pat. No. 7,557,015.

(51) Int. Cl.
*H01L 21/8242* (2006.01)
(52) U.S. Cl. .. 438/397; 438/254; 257/309; 257/E21.648
(58) Field of Classification Search .................. 438/397, 438/254; 257/309, E21.648
See application file for complete search history.

(56) References Cited

U.S. PATENT DOCUMENTS

| | | |
|---|---|---|
| 4,517,729 A | 5/1985 | Batra |
| 5,236,860 A | 8/1993 | Fazan et al. |
| 5,340,763 A | 8/1994 | Dennison |
| 5,401,681 A | 3/1995 | Dennison |
| 5,467,305 A | 11/1995 | Bertin et al. |
| 5,498,562 A | 3/1996 | Dennison et al. |
| 5,532,089 A | 7/1996 | Adair et al. |
| 5,604,696 A | 2/1997 | Takaishi |
| 5,605,857 A | 2/1997 | Jost et al. |
| 5,652,164 A | 7/1997 | Dennison et al. |
| 5,654,222 A | 8/1997 | Sandhu et al. |
| 5,686,747 A | 11/1997 | Jost et al. |
| 5,702,990 A | 12/1997 | Jost et al. |
| 5,705,838 A | 1/1998 | Jost et al. |
| 5,767,561 A | 6/1998 | Frei et al. |
| 5,784,112 A | 7/1998 | Ogasawara et al. |
| 5,821,140 A | 10/1998 | Jost et al. |
| 5,869,382 A | 2/1999 | Kubota |
| 5,900,660 A | 5/1999 | Jost et al. |
| 5,955,758 A | 9/1999 | Sandhu et al. |

(Continued)

FOREIGN PATENT DOCUMENTS

JP    08-274278    10/1996

(Continued)

OTHER PUBLICATIONS

US2004/0027898, Feb. 28, 2005, Written Opinion.

(Continued)

*Primary Examiner* — Steven J Fulk
(74) *Attorney, Agent, or Firm* — Wells St. John P.S.

(57) ABSTRACT

The invention includes methods of forming pluralities of capacitors. In one implementation, a method of forming a plurality of capacitors includes providing a plurality of capacitor electrodes within a capacitor array area over a substrate. The capacitor electrodes comprise outer lateral sidewalls. The plurality of capacitor electrodes is supported at least in part with a retaining structure which engages the outer lateral sidewalls. The retaining structure is formed at least in part by etching a layer of material which is not masked anywhere within the capacitor array area to form said retaining structure. The plurality of capacitor electrodes is incorporated into a plurality of capacitors. Other aspects and implementations are contemplated.

16 Claims, 25 Drawing Sheets

U.S. PATENT DOCUMENTS

| | | |
|---|---|---|
| 5,981,350 A | 11/1999 | Geusic et al. |
| 5,981,992 A | 11/1999 | Calpine Kenney |
| 5,990,021 A | 11/1999 | Prall et al. |
| 6,037,212 A | 3/2000 | Chao |
| 6,037,218 A | 3/2000 | Dennison et al. |
| 6,059,553 A | 5/2000 | Jin et al. |
| 6,090,700 A | 7/2000 | Tseng |
| 6,108,191 A | 8/2000 | Bruchhaus et al. |
| 6,110,774 A | 8/2000 | Jost et al. |
| 6,133,620 A | 10/2000 | Uochi |
| 6,159,818 A | 12/2000 | Durcan et al. |
| 6,180,450 B1 | 1/2001 | Dennison et al. |
| 6,204,143 B1 | 3/2001 | Roberts et al. |
| 6,204,178 B1 | 3/2001 | Marsh |
| 6,249,019 B1 | 6/2001 | Sandhu et al. |
| 6,258,650 B1 | 7/2001 | Sunouchi |
| 6,274,497 B1 | 8/2001 | Lou |
| 6,303,518 B1 | 10/2001 | Tian et al. |
| 6,303,956 B1 | 10/2001 | Sandhu et al. |
| 6,323,528 B1 | 11/2001 | Yamazaki et al. |
| 6,331,461 B1 | 12/2001 | Juengling |
| 6,372,554 B1 | 4/2002 | Kawakita et al. |
| 6,372,574 B1 | 4/2002 | Lane et al. |
| 6,383,861 B1 | 5/2002 | Gonzalez et al. |
| 6,399,490 B1 | 6/2002 | Jammy et al. |
| 6,403,442 B1 | 6/2002 | Reinberg |
| 6,432,472 B1 | 8/2002 | Farrell et al. |
| 6,458,653 B1 | 10/2002 | Jang |
| 6,458,925 B1 | 10/2002 | Fasano |
| 6,459,138 B2 | 10/2002 | Reinberg |
| 6,475,855 B1 | 11/2002 | Fishburn |
| 6,482,749 B1 | 11/2002 | Billington et al. |
| 6,617,222 B1 | 9/2003 | Coursey |
| 6,645,869 B1 | 11/2003 | Chu et al. |
| 6,656,748 B2 | 12/2003 | Hall et al. |
| 6,667,502 B1 * | 12/2003 | Agarwal et al. ............... 257/296 |
| 6,673,693 B2 | 1/2004 | Kirchhoff |
| 6,707,088 B2 | 3/2004 | Fishburn |
| 6,709,978 B2 | 3/2004 | Geusic et al. |
| 6,720,232 B1 | 4/2004 | Tu et al. |
| 6,767,789 B1 | 7/2004 | Bronner et al. |
| 6,784,112 B2 | 8/2004 | Arita et al. |
| 6,784,479 B2 | 8/2004 | Park |
| 6,787,833 B1 | 9/2004 | Fishburn |
| 6,812,513 B2 | 11/2004 | Geusic et al. |
| 6,822,261 B2 | 11/2004 | Yamakazi et al. |
| 6,822,280 B2 | 11/2004 | Ito et al. |
| 6,844,230 B2 | 1/2005 | Reinberg |
| 6,849,496 B2 | 2/2005 | Jaiprakash et al. |
| 6,893,914 B2 | 5/2005 | Kim et al. |
| 6,897,109 B2 | 5/2005 | Jin et al. |
| 6,927,122 B2 | 8/2005 | Geusic et al. |
| 6,930,640 B2 | 8/2005 | Chung et al. |
| 6,962,846 B2 | 11/2005 | Fishburn et al. |
| 6,991,980 B2 | 1/2006 | Park |
| 7,005,379 B2 | 2/2006 | Sinha et al. |
| 7,042,040 B2 | 5/2006 | Horiguchi |
| 7,064,028 B2 | 6/2006 | Ito et al. |
| 7,064,365 B2 | 6/2006 | An et al. |
| 7,071,055 B2 | 7/2006 | Fishburn |
| 7,073,969 B2 | 7/2006 | Kamm |
| 7,074,669 B2 | 7/2006 | Iijima et al. |
| 7,081,384 B2 | 7/2006 | Birner et al. |
| 7,084,451 B2 | 8/2006 | Forbes et al. |
| 7,125,781 B2 | 10/2006 | Manning et al. |
| 7,153,778 B2 | 12/2006 | Busch et al. |
| 7,160,788 B2 | 1/2007 | Sandhu et al. |
| 7,179,706 B2 | 2/2007 | Patraw et al. |
| 7,199,005 B2 | 4/2007 | Sandhu et al. |
| 7,202,127 B2 | 4/2007 | Busch et al. |
| 7,226,845 B2 | 6/2007 | Manning et al. |
| 7,235,441 B2 | 6/2007 | Yasui et al. |
| 7,268,034 B2 | 9/2007 | Basceri et al. |
| 7,268,039 B2 | 9/2007 | Fishburn et al. |
| 7,273,779 B2 | 9/2007 | Fishburn et al. |
| 7,279,379 B2 | 10/2007 | Tran et al. |
| 7,282,756 B2 | 10/2007 | Agarwal et al. |
| 7,288,806 B2 | 10/2007 | Tran et al. |
| 7,320,911 B2 | 1/2008 | Basceri et al. |
| 7,321,149 B2 | 1/2008 | Busch et al. |
| 7,321,150 B2 | 1/2008 | Fishburn et al. |
| 7,335,935 B2 | 2/2008 | Sinha et al. |
| 7,341,909 B2 | 3/2008 | McDaniel et al. |
| 7,384,847 B2 | 6/2008 | Tran et al. |
| 7,387,939 B2 | 6/2008 | Manning |
| 7,393,741 B2 | 7/2008 | Sandhu et al. |
| 7,413,952 B2 | 8/2008 | Busch et al. |
| 7,440,255 B2 | 10/2008 | McClure et al. |
| 7,442,600 B2 | 10/2008 | Wang et al. |
| 7,445,990 B2 | 11/2008 | Busch et al. |
| 7,449,391 B2 | 11/2008 | Manning et al. |
| 7,517,754 B2 | 4/2009 | McDaniel et al. |
| 7,538,036 B2 | 5/2009 | Busch et al. |
| 7,638,392 B2 | 12/2009 | Wang et al. |
| 2001/0012223 A1 | 8/2001 | Kohyama |
| 2001/0026974 A1 | 10/2001 | Reinberg |
| 2001/0044181 A1 | 11/2001 | Nakamura |
| 2002/0022339 A1 | 2/2002 | Kirchhoff |
| 2002/0030221 A1 | 3/2002 | Sandhu et al. |
| 2002/0039826 A1 | 4/2002 | Reinberg |
| 2002/0086479 A1 | 7/2002 | Reinberg |
| 2002/0090779 A1 | 7/2002 | Jang |
| 2002/0098654 A1 | 7/2002 | Durcan et al. |
| 2002/0153589 A1 | 10/2002 | Oh |
| 2002/0153614 A1 | 10/2002 | Ema et al. |
| 2002/0163026 A1 | 11/2002 | Park |
| 2003/0085420 A1 | 5/2003 | Ito et al. |
| 2003/0153146 A1 | 8/2003 | Won et al. |
| 2003/0178684 A1 | 9/2003 | Nakamura |
| 2003/0190782 A1 | 10/2003 | Ko et al. |
| 2003/0227044 A1 * | 12/2003 | Park ........................... 257/301 |
| 2004/0018679 A1 | 1/2004 | Yu et al. |
| 2004/0056295 A1 | 3/2004 | Agarwal et al. |
| 2004/0110340 A1 | 6/2004 | Kim et al. |
| 2004/0150070 A1 | 8/2004 | Okada et al. |
| 2004/0188738 A1 | 9/2004 | Farnworth et al. |
| 2005/0023588 A1 | 2/2005 | Sandhu et al. |
| 2005/0051822 A1 | 3/2005 | Manning |
| 2005/0054159 A1 | 3/2005 | Manning et al. |
| 2005/0104110 A1 | 5/2005 | Yeo et al. |
| 2005/0158949 A1 | 7/2005 | Manning |
| 2005/0176210 A1 | 8/2005 | Kim et al. |
| 2005/0287780 A1 | 12/2005 | Manning et al. |
| 2006/0014344 A1 | 1/2006 | Manning |
| 2006/0024958 A1 | 2/2006 | Ali |
| 2006/0046420 A1 | 3/2006 | Manning |
| 2006/0051918 A1 | 3/2006 | Busch et al. |
| 2006/0063344 A1 | 3/2006 | Manning et al. |
| 2006/0063345 A1 | 3/2006 | Manning et al. |
| 2006/0115951 A1 | 6/2006 | Mosley |
| 2006/0115952 A1 | 6/2006 | Wu |
| 2006/0121672 A1 | 6/2006 | Basceri et al. |
| 2006/0148190 A1 | 7/2006 | Busch et al. |
| 2006/0176210 A1 | 8/2006 | Nakamura et al. |
| 2006/0186451 A1 | 8/2006 | Dusberg et al. |
| 2006/0211211 A1 | 9/2006 | Sandhu et al. |
| 2006/0237762 A1 | 10/2006 | Park |
| 2006/0249798 A1 | 11/2006 | Manning |
| 2006/0261440 A1 | 11/2006 | Manning |
| 2006/0263968 A1 | 11/2006 | Manning |
| 2007/0032014 A1 | 2/2007 | Sandhu et al. |
| 2007/0048976 A1 | 3/2007 | Raghu |
| 2007/0093022 A1 | 4/2007 | Basceri |
| 2007/0099328 A1 | 5/2007 | Chiang et al. |
| 2007/0099423 A1 | 5/2007 | Chen et al. |
| 2007/0145009 A1 | 6/2007 | Fucsko et al. |
| 2007/0196978 A1 | 8/2007 | Manning |
| 2007/0207622 A1 | 9/2007 | Rana et al. |
| 2007/0238259 A1 | 10/2007 | Bhat |
| 2007/0257323 A1 | 11/2007 | Tsui et al. |
| 2008/0090416 A1 | 4/2008 | Raghu et al. |
| 2009/0047769 A1 | 2/2009 | Bhat et al. |

FOREIGN PATENT DOCUMENTS

| | | |
|---|---|---|
| JP | 10-189912 | 7/1998 |
| JP | 11-191615 | 7/1999 |
| JP | 2000-196038 | 7/2000 |

| | | |
|---|---|---|
| JP | 2003-264246 | 9/2003 |
| JP | 2003-273247 | 9/2003 |
| JP | 2003-297952 | 10/2003 |
| JP | 2004072078 | 3/2004 |
| JP | 2004-111626 | 4/2004 |
| JP | 2004-128463 | 4/2004 |
| JP | 2005032982 | 2/2005 |
| JP | 2006-135364 | 5/2006 |
| KR | 20010061020 | 7/2001 |
| KR | 10-2001-108963 | 12/2001 |
| KR | 1020030058018 | 7/2003 |
| KR | 1020050000896 | 1/2005 |
| KR | 10-520223 | 10/2005 |
| WO | PCT/US2005/024936 | 3/2005 |
| WO | PCT/US2008/070071 | 2/2010 |

OTHER PUBLICATIONS

US2004/0027898, Feb. 28, 2005, Search Report.
US2004/0040252, May 25, 2005, Search Report.
US2006/06806, Feb. 27, 2006, Response to Written Opinion.
US2006/06806, Jul. 26, 2006, Written Opinion.
US2006/06806, Jul. 26, 2006, Search Report.
US2006/06806, Mar. 30, 2007, IPER.
WO2005/024936, Mar. 17, 2005, Search Report.
Banhart, "Aluminum Foams: On the road to Real Applications", MRS Bulletin, pp. 290-295 (Apr. 2003).
Crouse et al., "Self-Assembled Nanostructures Using Anodized Alumina Thin Films for Optoelectronic Applications", IEEE, pp. 234-234 (1999).
Gibson (Guest Editor), "Cellular Solids", MRS Bulletin, pp. 270-274 (Apr. 2003).
Green et al., "Cellular Ceramics: Intriguing Structures", Novel Properties, and Innovative Applications, MRS Bulletin, pp. 296-300 (Apr. 2003).
Green et al., "The Structure and Applications of Cellular Ceramics", 28 MRS Bulletin, pp. 296-300, (Apr. 2003).
Karp et al., "Scaffolds for Tissue Engineering", Mrs Bulletin, pp. 301-302 (Apr. 2003).
Kim et al., "A mechanically enhanced storage node for virtually unlimited height (MESH) capacitor aiming at sub 70nm DRAMs", IEEE Jan. 2004, pp. 69-72.
Konovalov et al., "Chemistry of Materials", Chem. Mater., vol. 11, No. 8, pp. 1949-1951 (Aug. 1999).
Kraynik, "Foam Structure: From Soap Froth to Solid Foams", MRS Bulletin, pp. 275-278 (Apr. 2003).
Li et al., "Metal-assisted chemical etching in JF/H2O2 produces porous silicon", Applied Physics Letters, vol. 77, No. 16, Oct. 16, 2000, pp. 2572-2574.
Liang et al., "Nonlithographic Fabrication of Lateral Superlattices for Nanometric Electromagnetic-Optic . . . ", Ieee J. Selected Topics in Quantum Electric, vol. 8, No. 5, pp. 998-1008 (Sep./Oct. 2002).
Liu et al., "Ordered anodic alumina nanochannels on focused-ion-beam-prepatterned aluminum surfaces", Appl. Phys. Lett., vol. 78, No. 1, pp. 120-122 (Jan. 2001).
Maire et al., "In Situ X-Ray Tomography Measurements of Deformation in Cellular Solids", MRS Bulletin, pp. 284-289 (Apr. 2003).
Masuda et al., "Highly ordered nanochannel-array architecture in anodic alumina", App. Phys. Lett, vol. 71, No. 19, pp. 2770-2772 (Nov. 1997).
Nadeem et al., "Fabrication of Microstructuers Using Aluminum Anodization Techniques", pp. 274-277 (pre-2004).
Oh et al., "Preparation and Pore-Characteristics Control of Nano-Porous Materials Using Organometallic Building Blocks", 4 Carbon Science, No. 1, pp. 1-9 (Mar. 2003).
Onck, "Scale Effects in Cellular Metals", MRS Bulletin, pp. 279-283 (Apr. 2003).
O'Sullivan et al., "The morphology and mechanism of formation of porous anodic films on aluminum", Proc. Roy. Soc. Lond. A, vol. 317, pp. 511-543 (1970).
Park et al., "Block Copolymer Lithography: Periodic Arrays of ~1011 Holes in 1 Square Centimeter", 276 Science, pp. 1401-1404 (May 30, 1997).
Park et al., "Novel Robust Cell Capacitor (Leaning Exterminated Ring Type Insulator) and New Storage Node Contact (Top Spacer Contact) for 70nm DRAM Technology and Beyond", IEEE 2004 Symposium on VLSI Technology Digest of Technical Papers, pp. 34-35.
Shingubara, "Fabrication of nanomaterials using porous alumina templates", J. Nanoparticle Res., vol. 5, pp. 17-30 (2003).
Tan et al., "High Aspect Ratio Microstructures on Porous Anodic Aluminum Oxide", IEEE, pp. 267-272 (1995).
Tsukada et al., "Preparation and Application of Porous Silk Fibroin Materials", 54 Journal of Applied Polymer Science, pp. 507-514 (1994).
Yasaitis et al., "A modular process for integrating thick polysilicon MEMS devices with sub-micron CMOS", Pre-2004, Analog Devices, pp. 1-10.
PCT/US08/070071 dated Jul. 7, 2009; PCT Search Report.
PCT/US08/070071 dated Jul. 7, 2009; PCT Written Opinion.

* cited by examiner

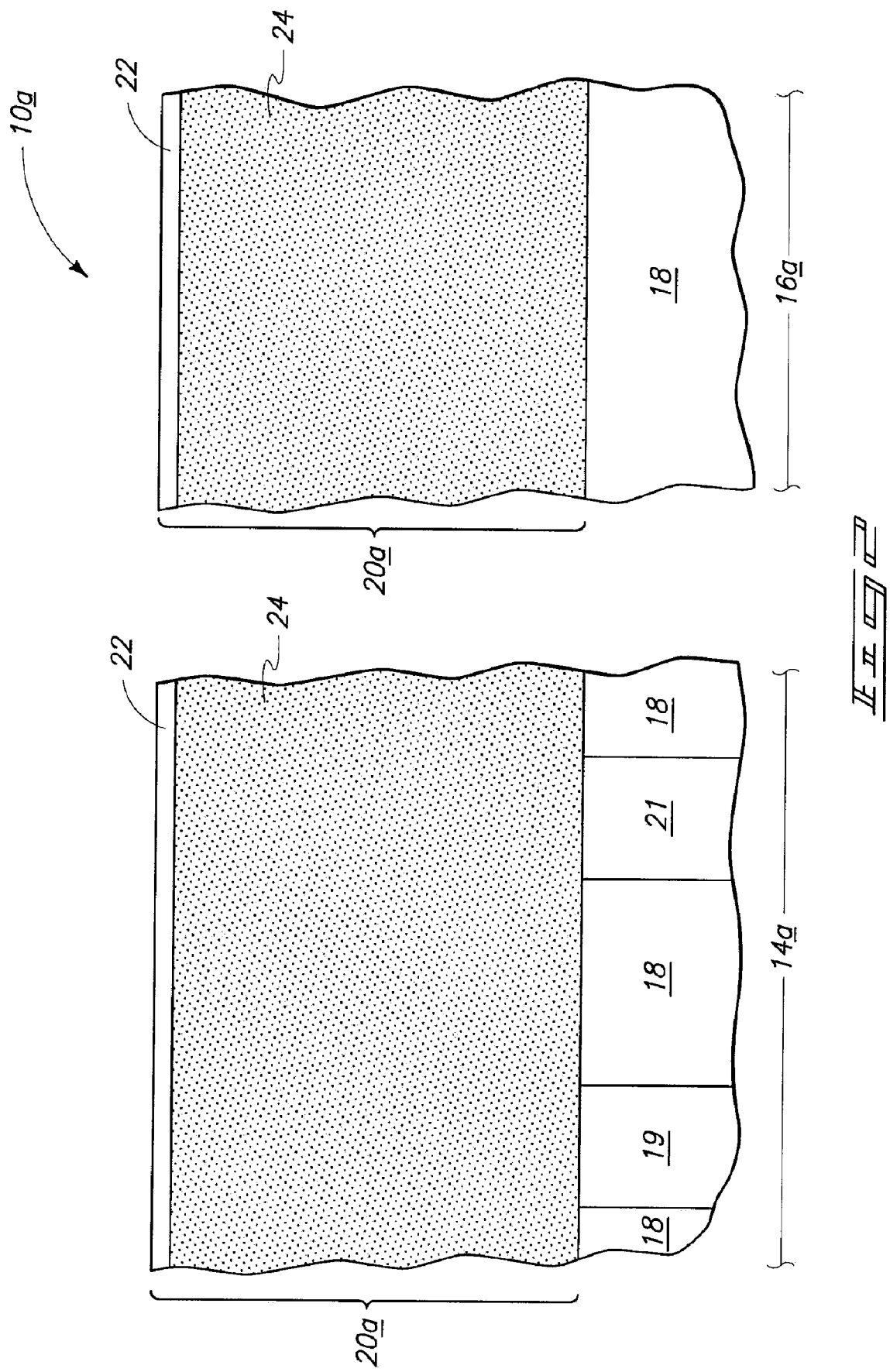

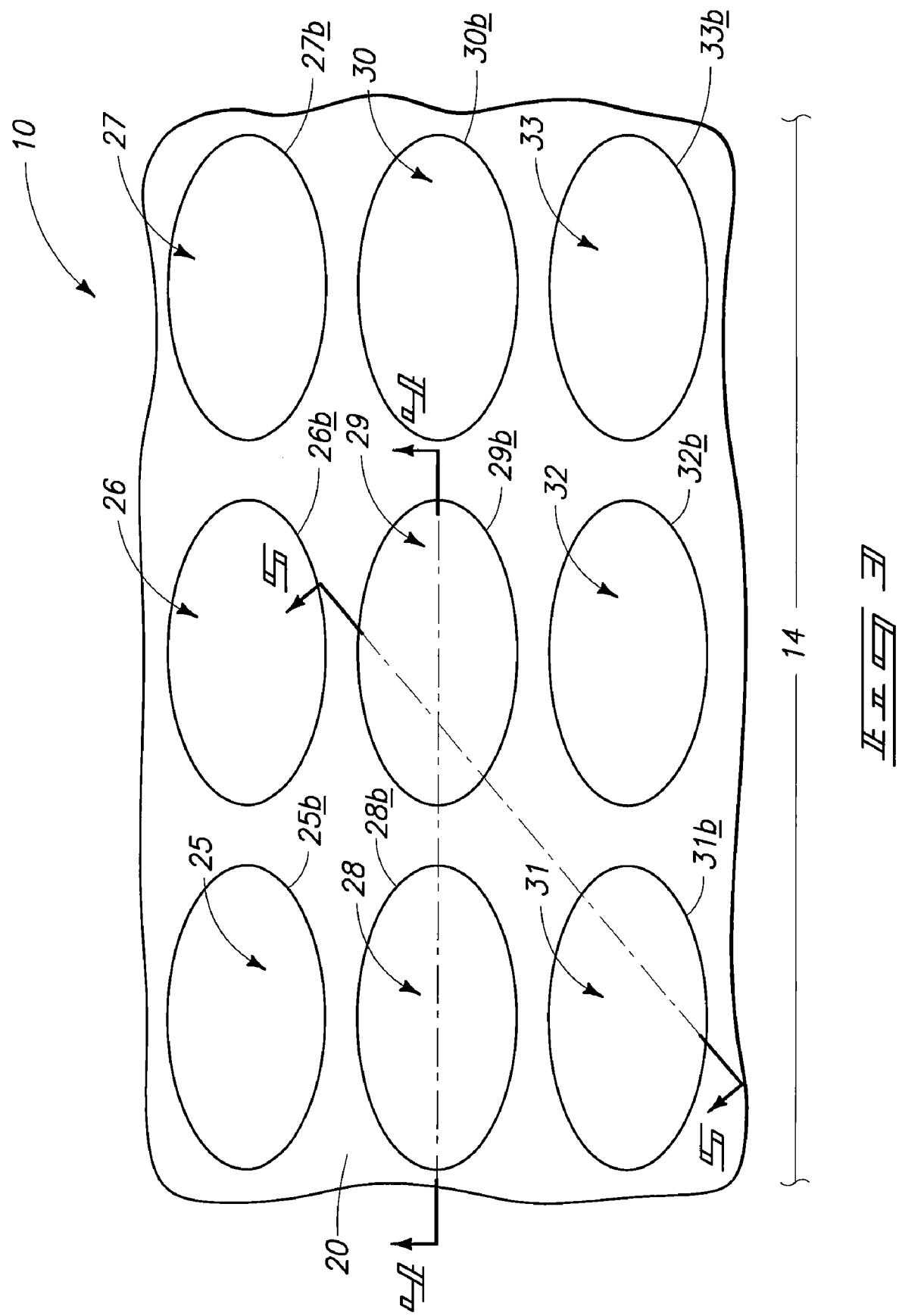

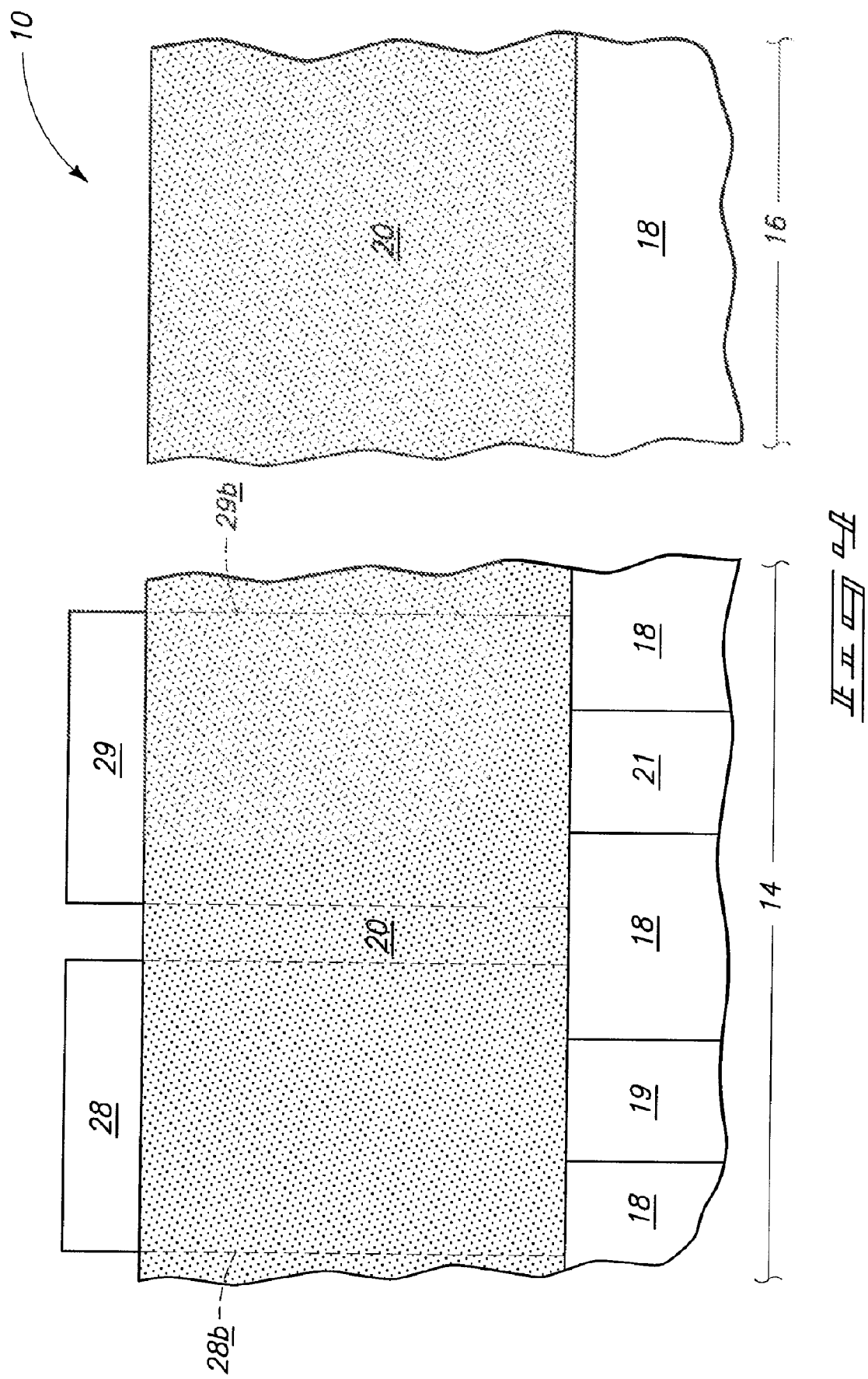

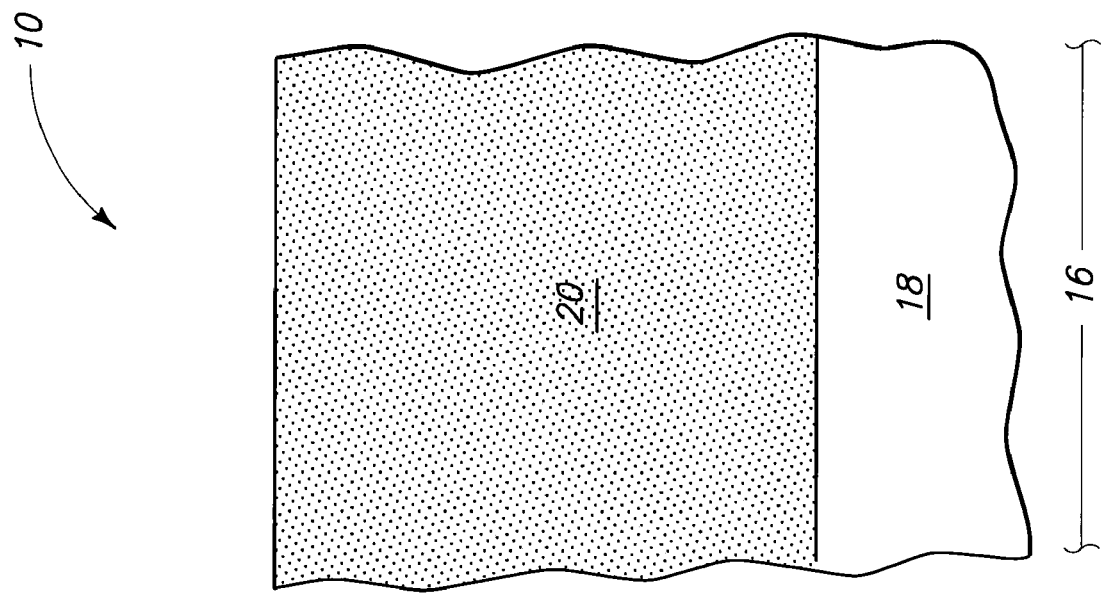
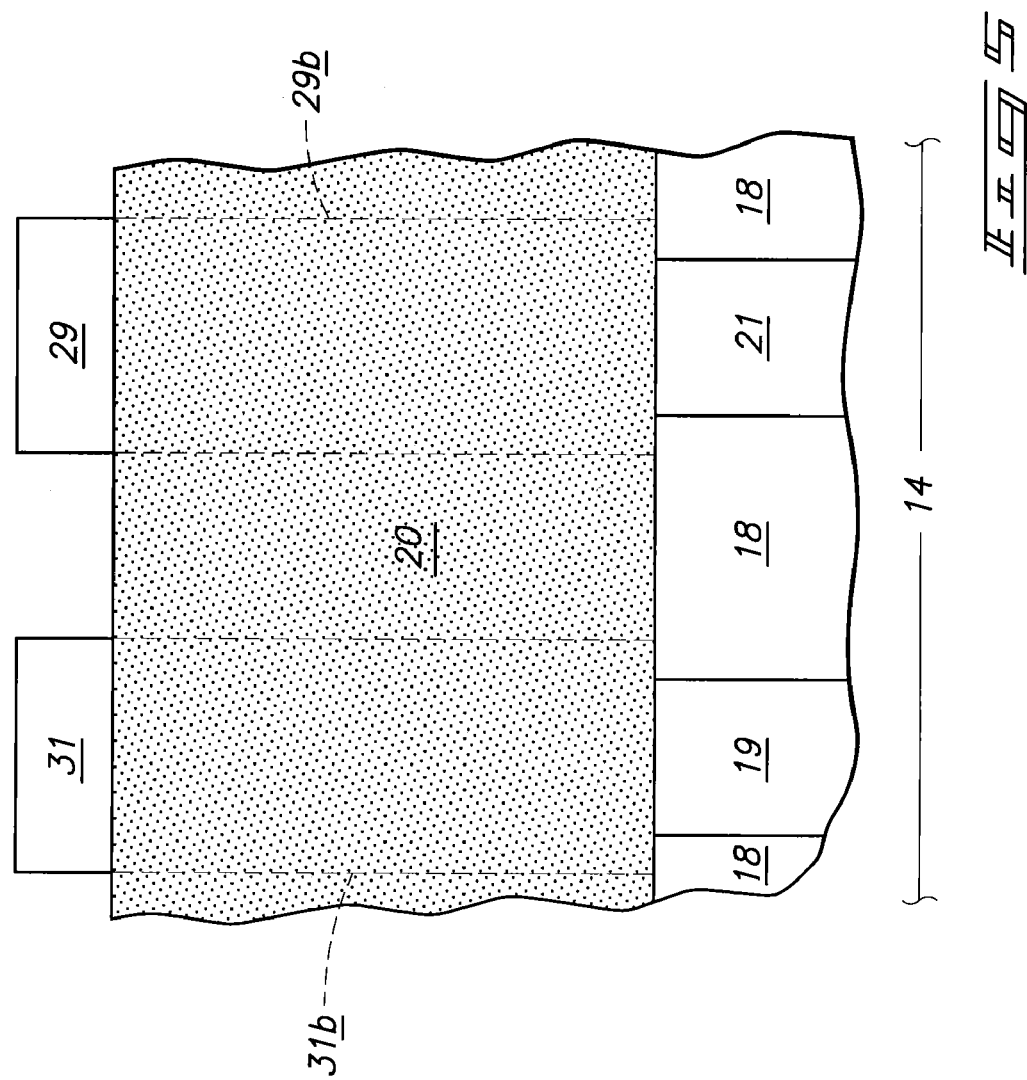

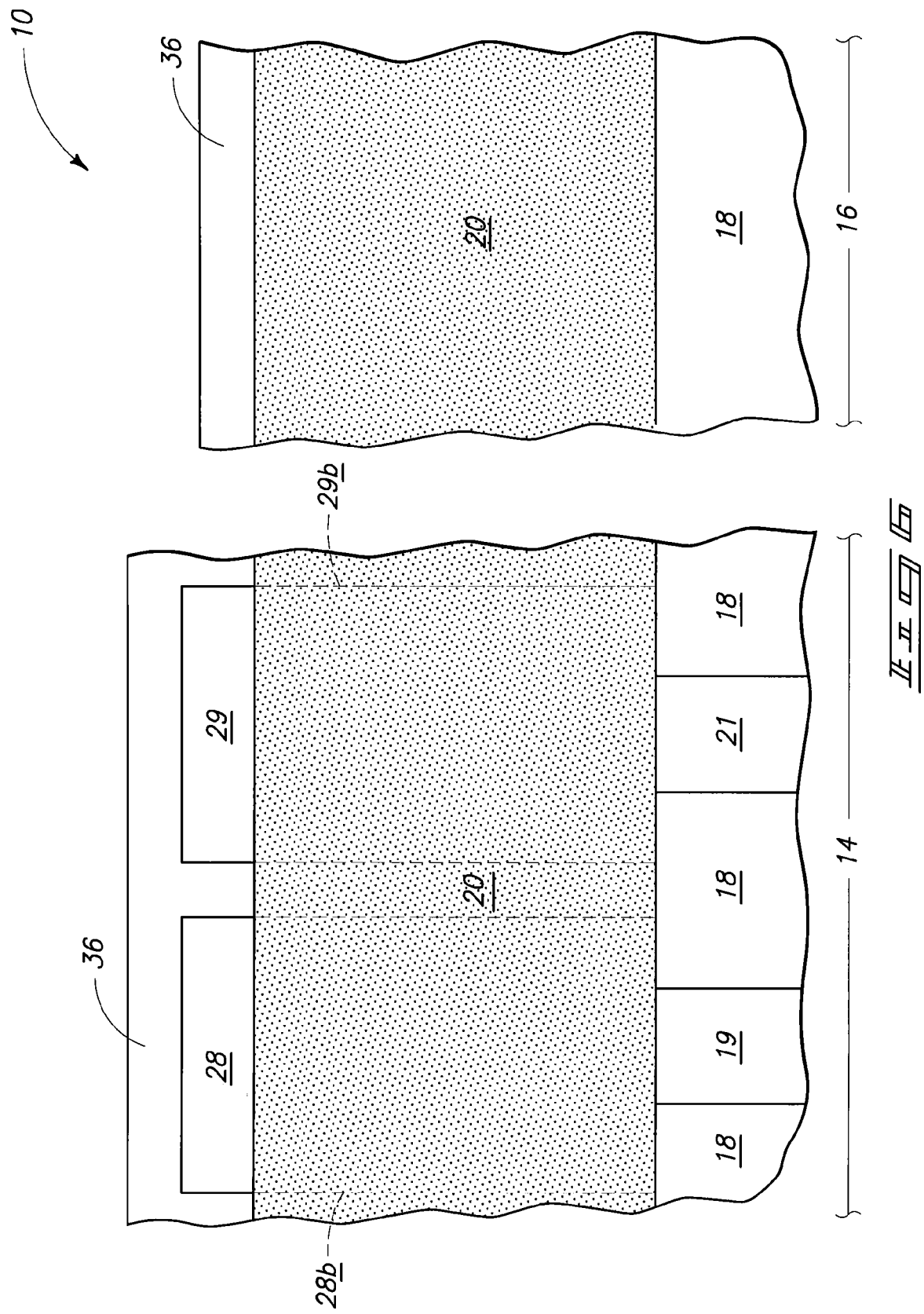

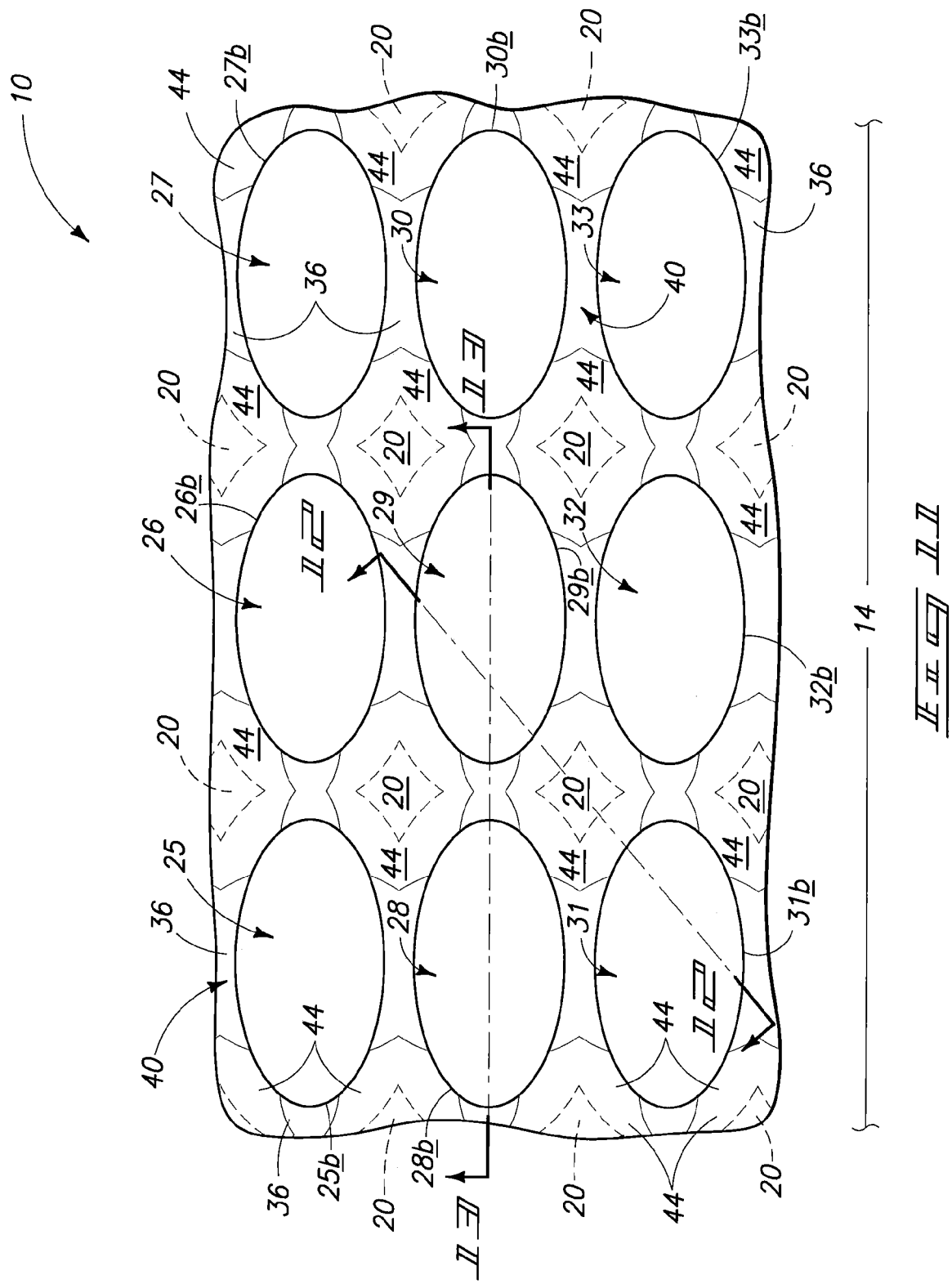

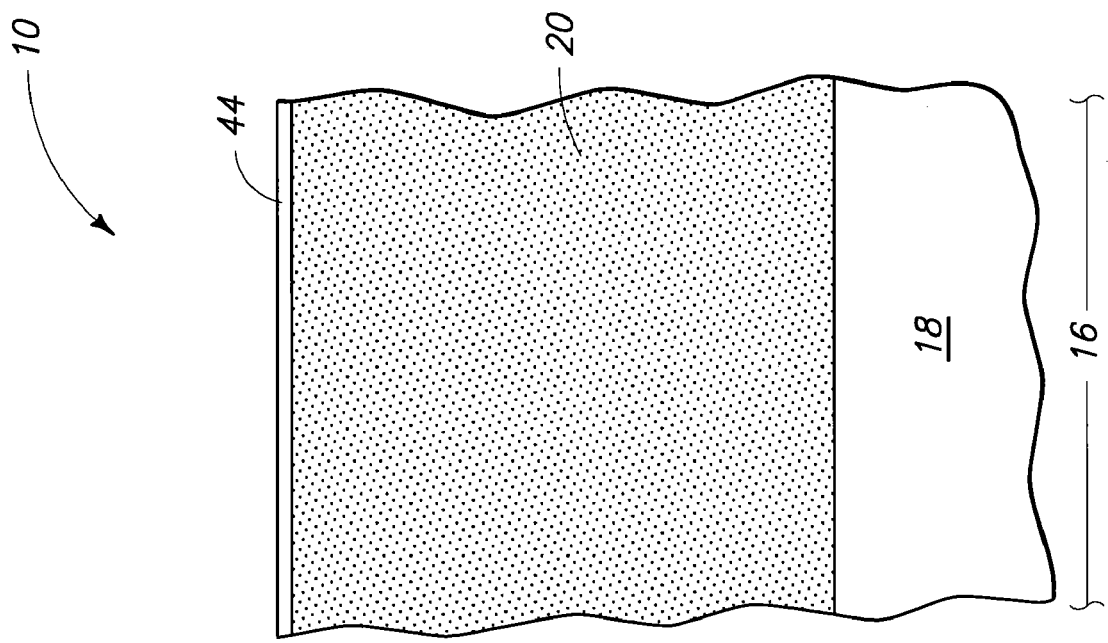
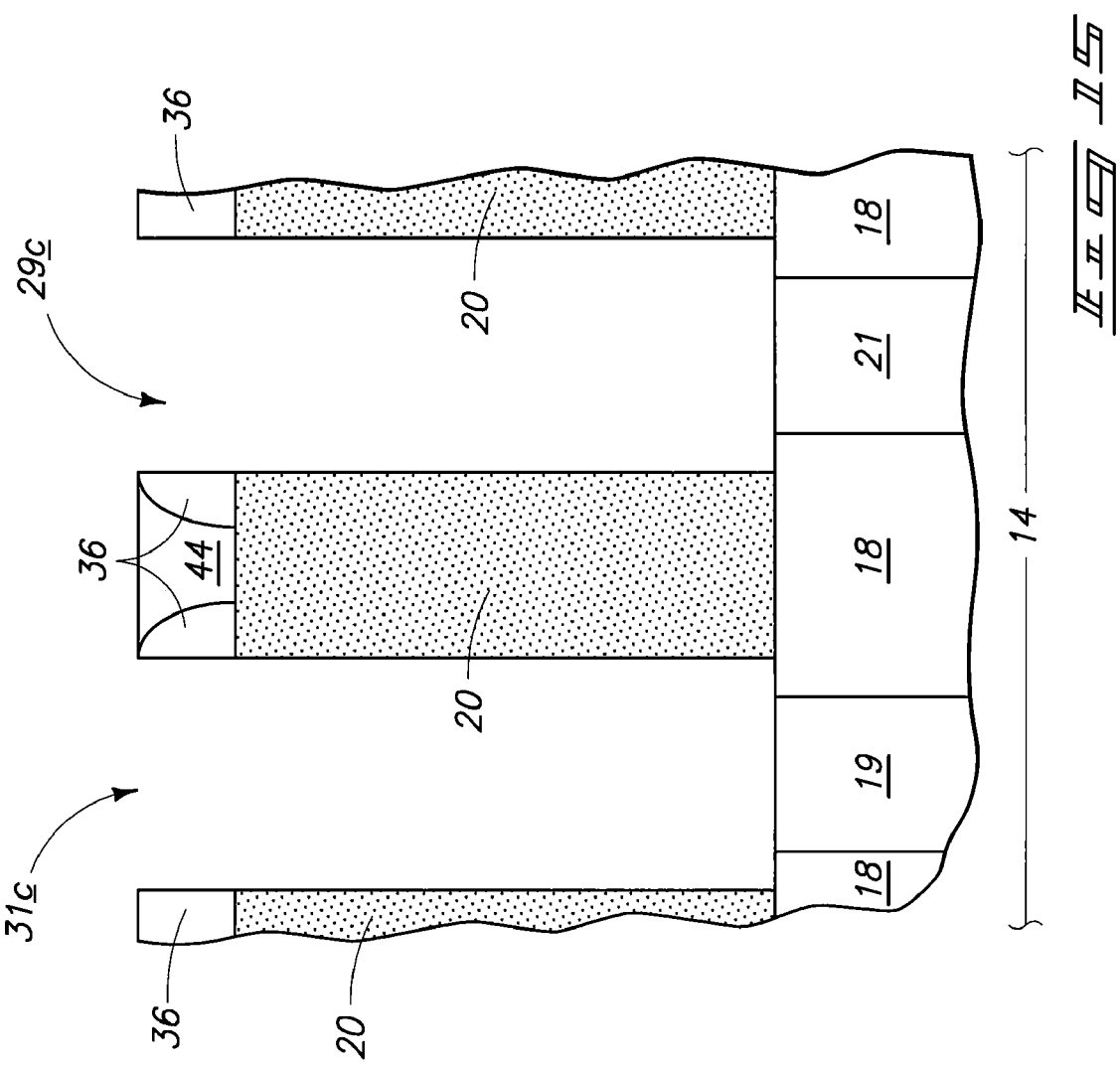
FIG. 15

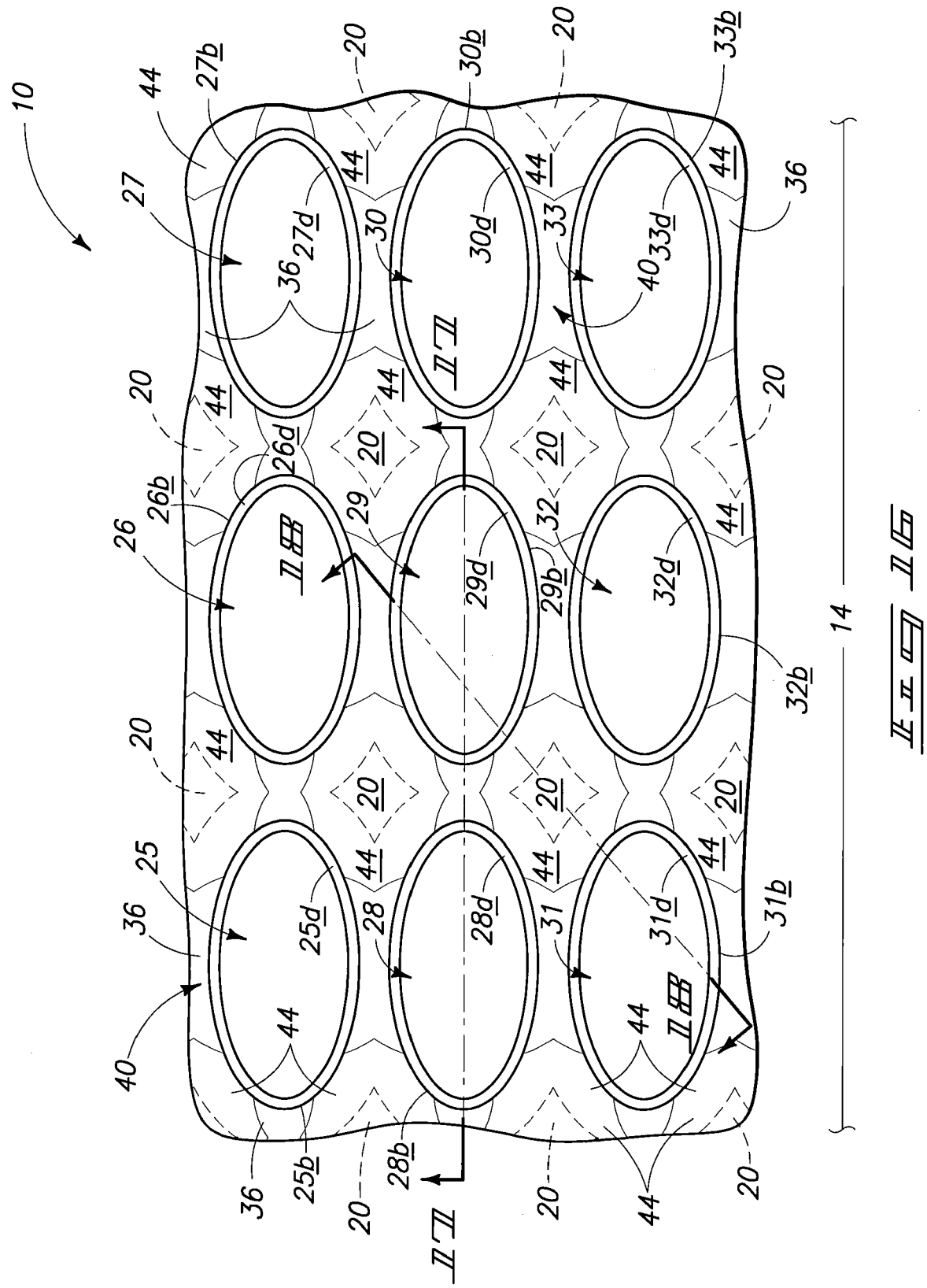

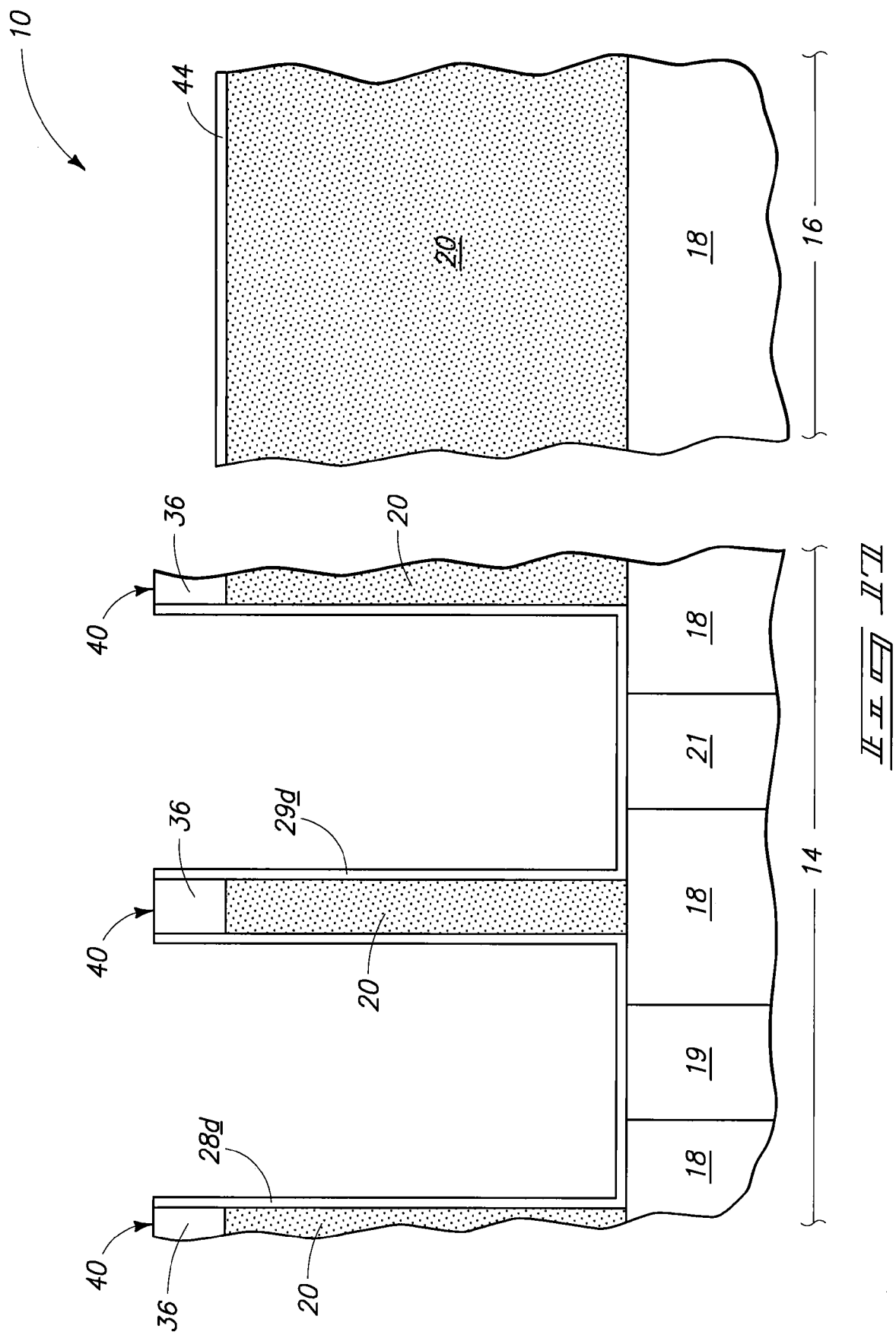

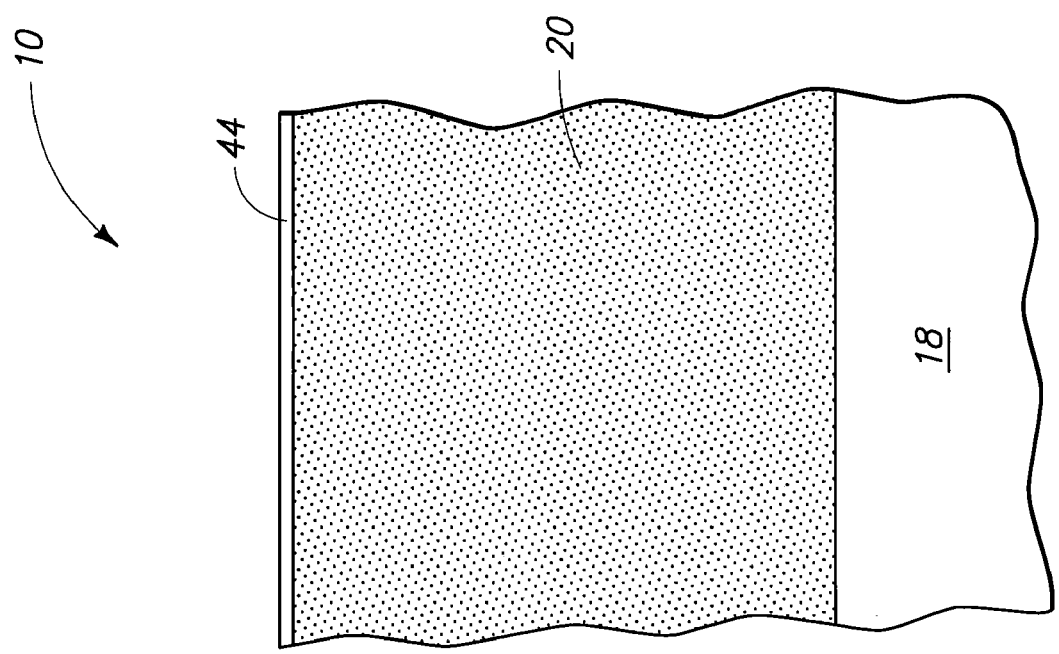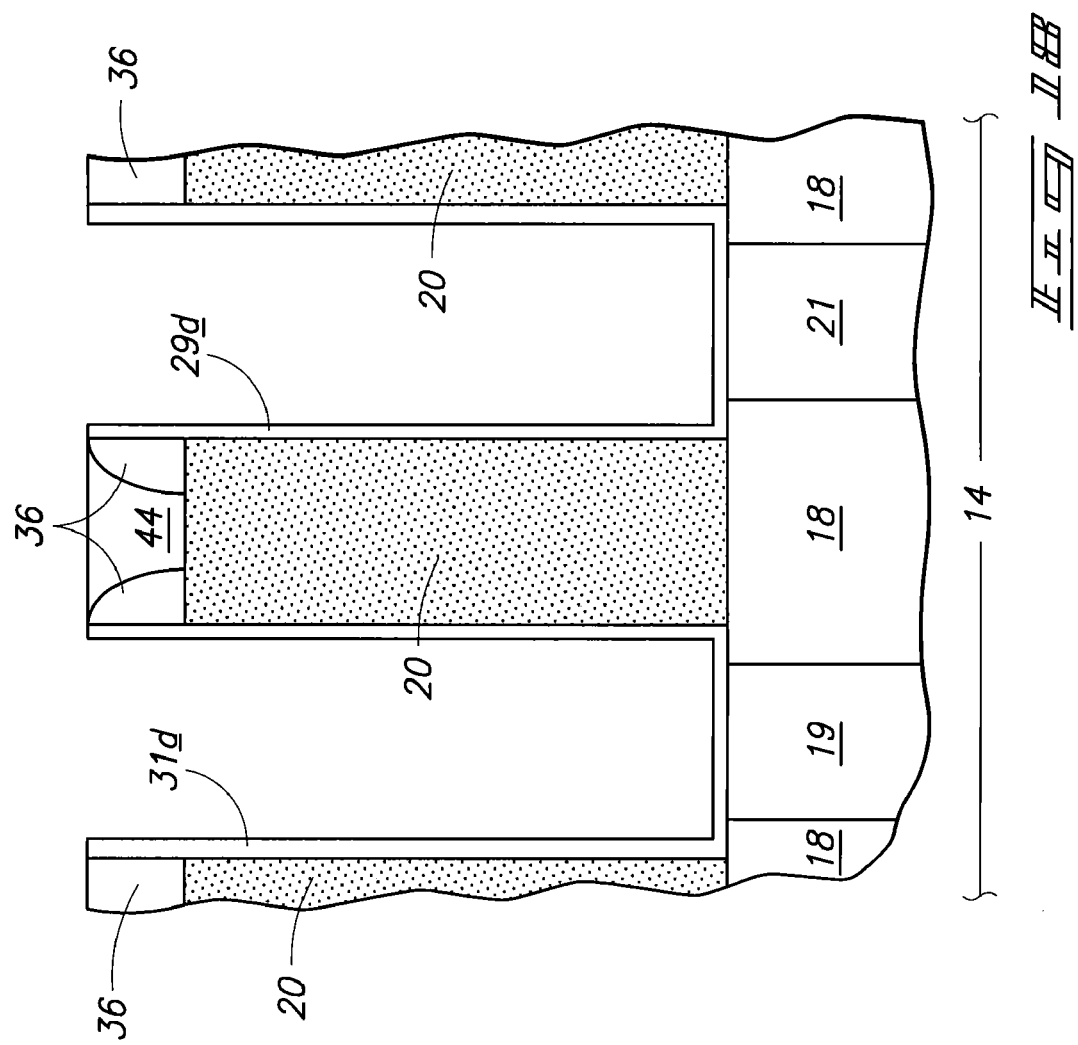
FIG. 18B

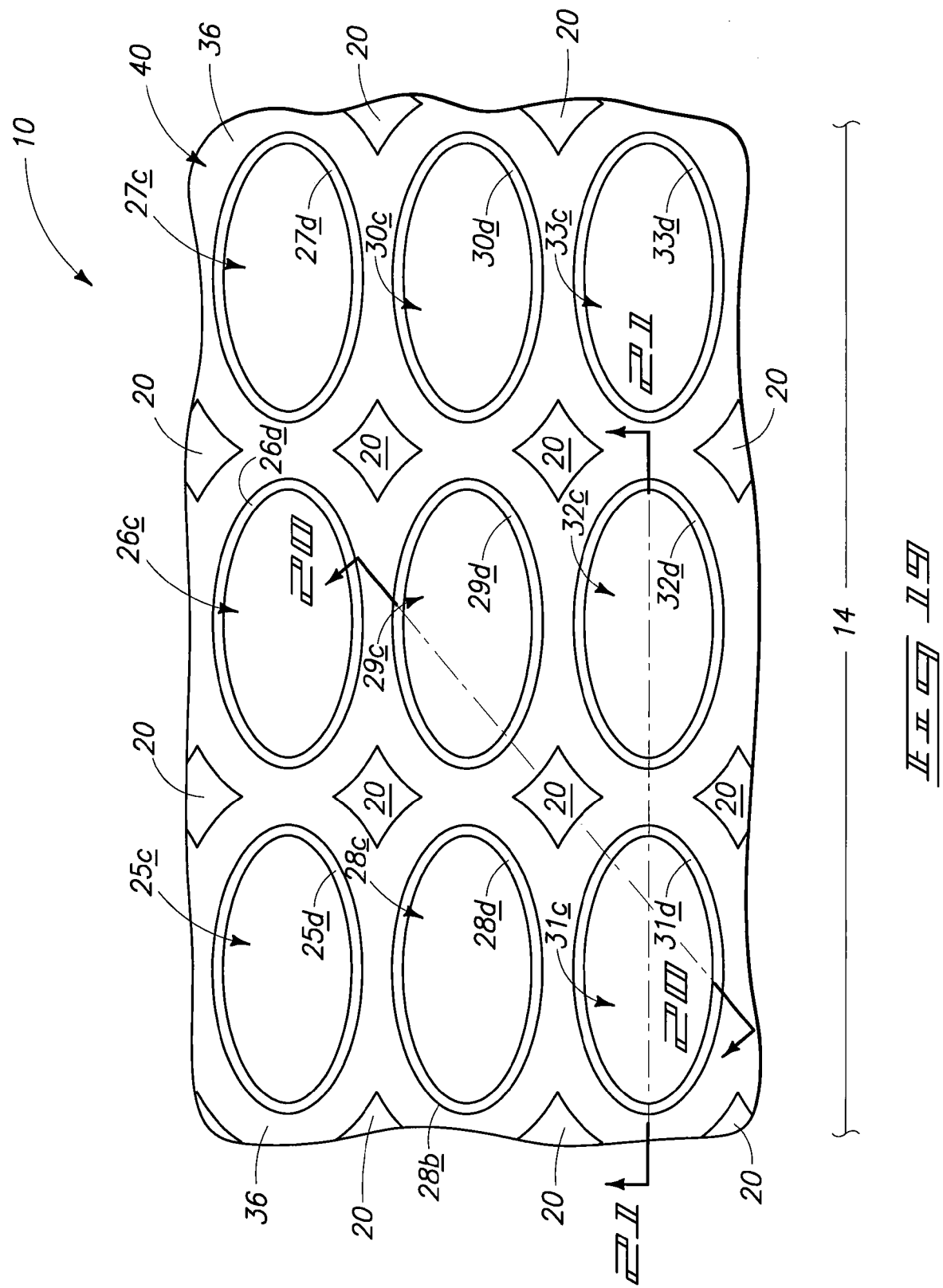

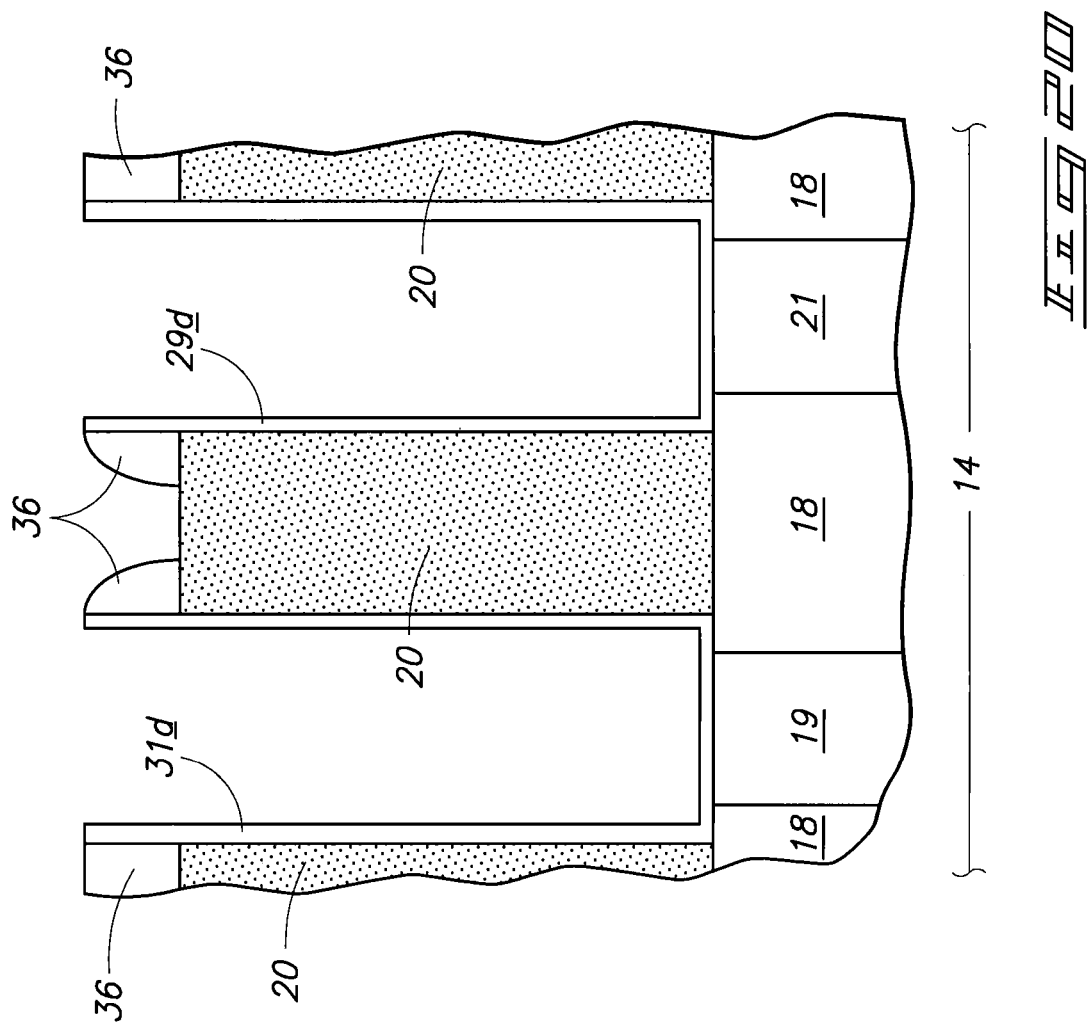

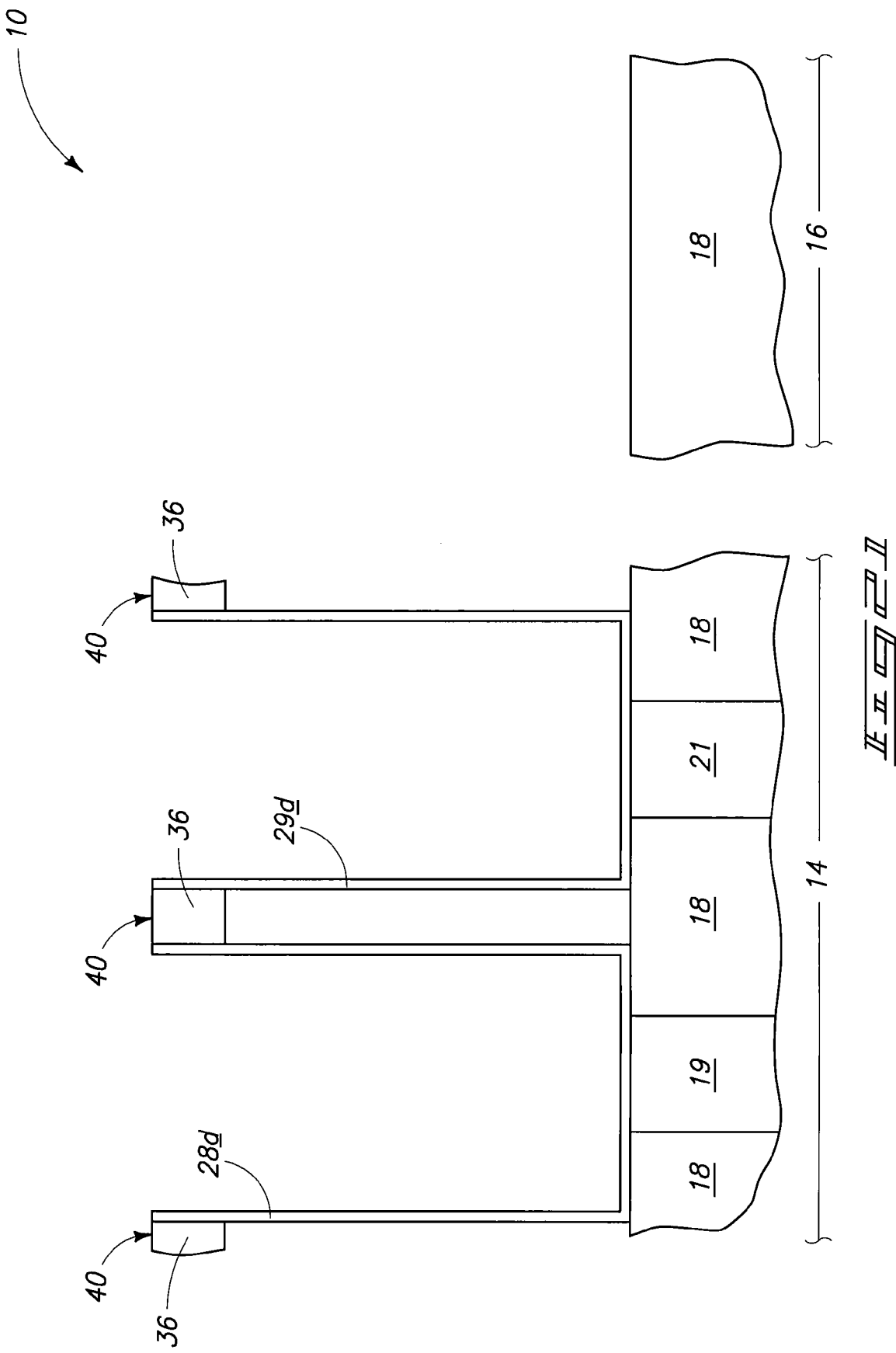

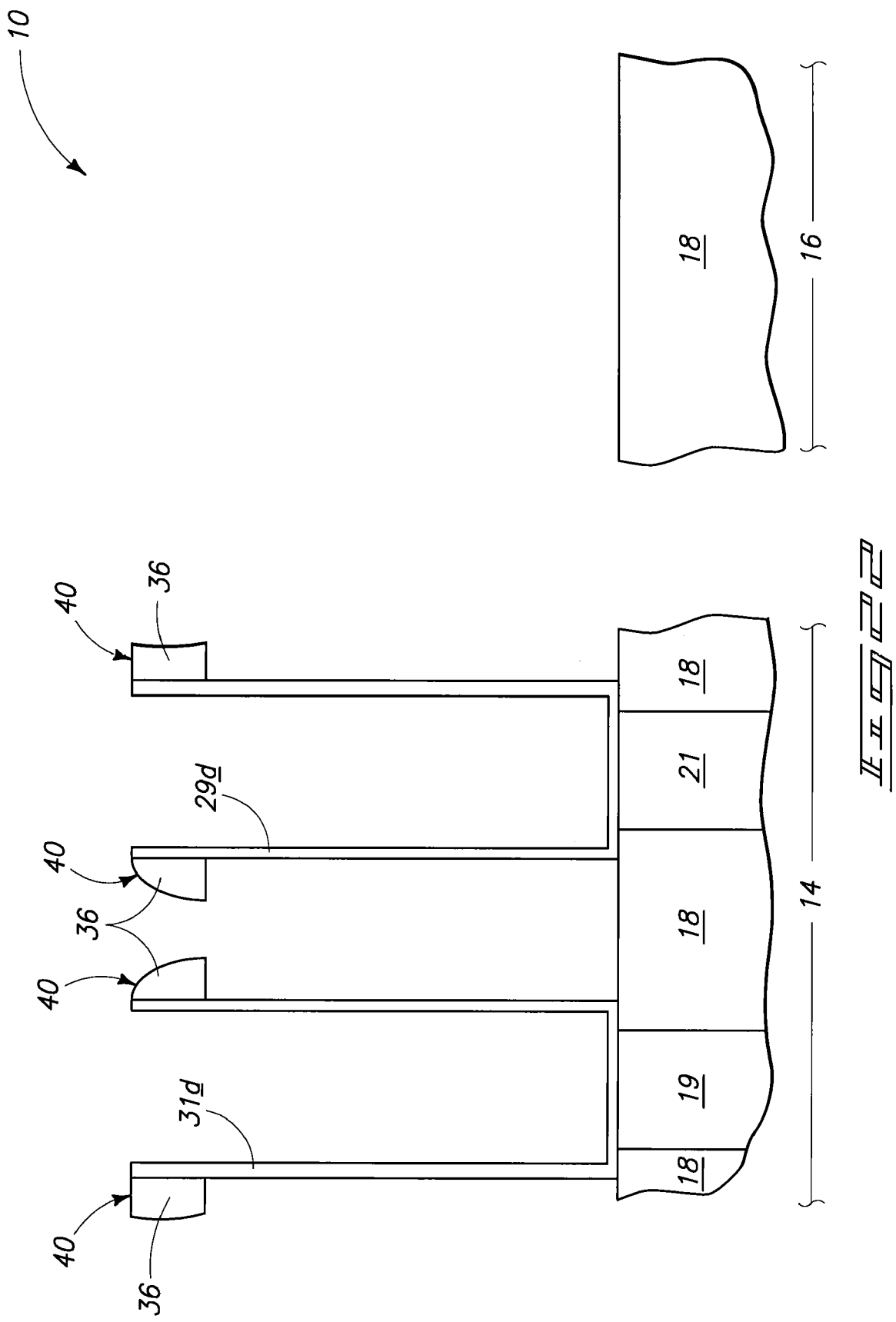

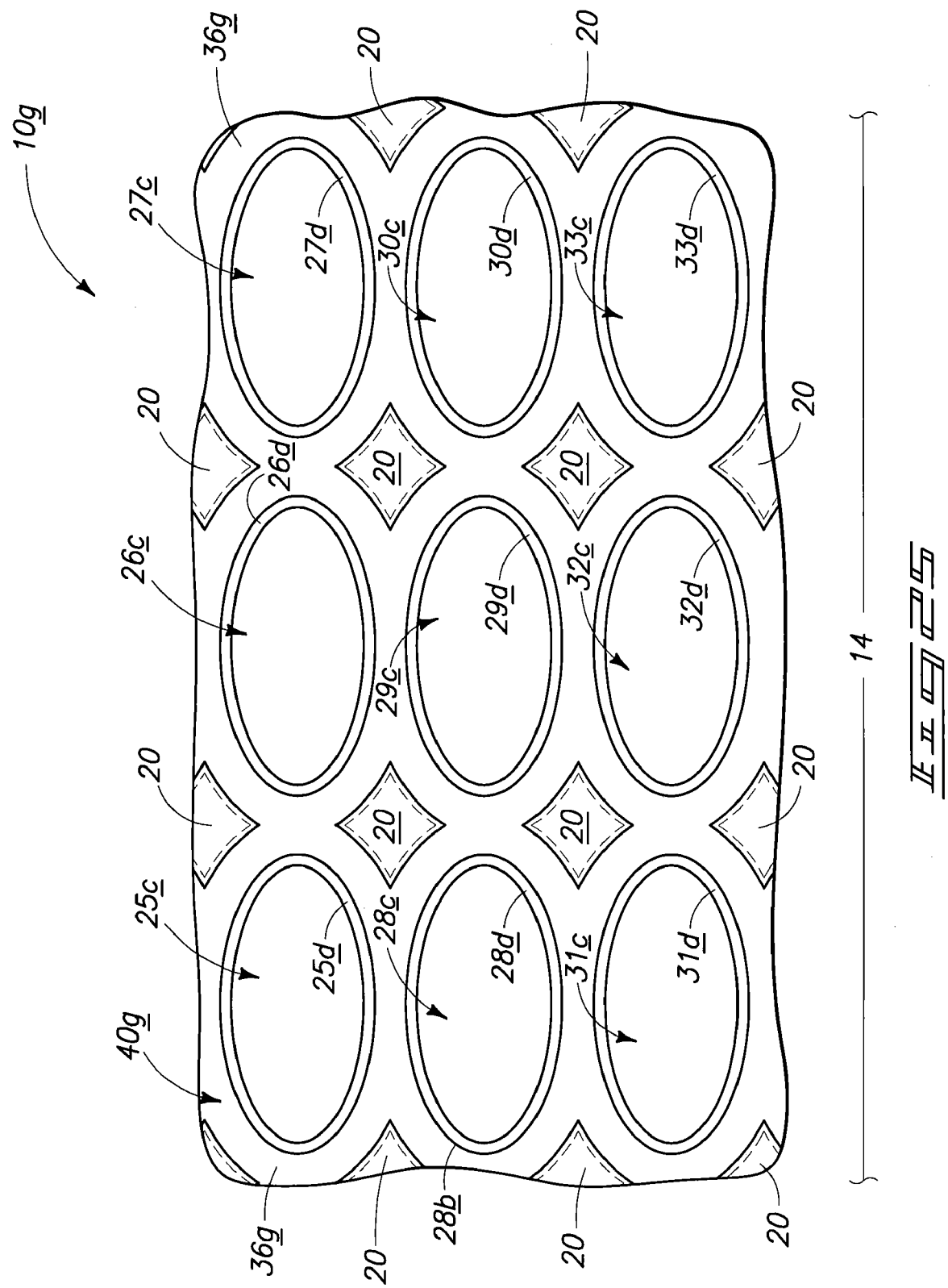

METHODS OF FORMING PLURALITIES OF CAPACITORS

RELATED PATENT DATA

This patent resulted from a continuation application of U.S. patent application Ser. No. 11/083,489, filed Mar. 18, 2005 now U.S. Pat. No. 7,557,015, entitled "Methods of Forming Pluralities of Capacitors", naming Gurtej S. Sandhu and D. Mark Durcan as inventors, the disclosure of which is incorporated by reference.

TECHNICAL FIELD

This invention relates to methods of forming pluralities of capacitors.

BACKGROUND OF THE INVENTION

Capacitors are one type of component which is commonly used in the fabrication of integrated circuits, for example in DRAM circuitry. A typical capacitor is comprised of two conductive electrodes separated by a non-conducting dielectric region. As integrated circuitry density has increased, there is a continuing challenge to maintain sufficiently high storage capacitance despite typical decreasing capacitor area. The increase in density of integrated circuitry has typically resulted in greater reduction in the horizontal dimension of capacitors as compared the vertical dimension. In many instances, the vertical dimension of capacitors has increased.

One manner of forming capacitors is to initially form an insulative material within which a capacitor storage node electrode is formed. For example, an array of capacitor electrode openings for individual capacitors is typically fabricated in such insulative capacitor electrode-forming material, with a typical insulative electrode-forming material being silicon dioxide doped with one or both of phosphorus and boron. The capacitor electrode openings are typically formed by etching. However, it can be difficult to etch the capacitor electrode openings within the insulative material, particularly where the openings are deep.

Further and regardless, it is often desirable to etch away most if not all of the capacitor electrode-forming material after individual capacitor electrodes have been formed within the openings. Such enables outer sidewall surfaces of the electrodes to provide increased area, and thereby increased capacitance for the capacitors being formed. However, the capacitor electrodes formed in deep openings are typically correspondingly much taller than they are wide. This can lead to toppling of the capacitor electrodes either during the etch to expose the outer sidewall surfaces, during transport of the substrate, and/or during deposition of the capacitor dielectric layer or outer capacitor electrode layer. Our U.S. Pat. No. 6,667,502 teaches provision of a brace or retaining structure intended to alleviate such toppling.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of forming pluralities of capacitors. In one implementation, a method of forming a plurality of capacitors includes providing a plurality of capacitor electrodes within a capacitor array area over a substrate. The capacitor electrodes comprise outer lateral sidewalls. The plurality of capacitor electrodes is supported at least in part with a retaining structure which engages the outer lateral sidewalls. The retaining structure is formed at least in part by etching a layer of material which is not masked anywhere within the capacitor array area to form said retaining structure. The plurality of capacitor electrodes is incorporated into a plurality of capacitors.

In one implementation, a method of forming a plurality of capacitors includes forming different composition first, second and third materials over a capacitor electrode-forming material. The first, second and third materials are received at least in part at some common elevation over the capacitor electrode-forming material. The second material comprises an anisotropically etched retaining structure. The first material is etched substantially selectively relative to the second and third materials followed by etching the capacitor electrode-forming material substantially selectively relative to the second and third materials effective to form a plurality of capacitor electrode openings. Individual capacitor electrodes are formed within individual of the capacitor electrode openings. The third material is etched substantially selectively relative to the second material and substantially selectively relative to the capacitor electrodes effective to expose capacitor electrode-forming material underlying said third material being etched. This is followed by etching the capacitor electrode-forming material substantially selectively relative to the second material and substantially selectively relative to the capacitor electrodes effective to expose outer lateral sidewalls of the capacitor electrodes and leave at least some of the retaining structure supporting the capacitor electrodes. The plurality of capacitor electrodes is incorporated into a plurality of capacitors.

Other aspects and implementations are contemplated.

BRIEF DESCRIPTION OF THE DRAWINGS

Preferred embodiments of the invention are described below with reference to the following accompanying drawings.

FIG. 2 is an alternate embodiment to that depicted by FIG. 1.

FIG. 3 is a top view of the left portion of FIG. 1 at a processing step subsequent to that of FIG. 1.

FIG. 4 is a view of the FIG. 3, with the left portion of FIG. 4 being taken through line 4-4 in FIG. 3.

FIG. 5 is a view of the FIG. 3 substrate, with the left portion of FIG. 5 being taken through line 5-5 in FIG. 3.

FIG. 6 is a view of the FIG. 4 substrate at a processing step subsequent to that shown by FIG. 4.

FIG. 13 is a view of the FIG. 10 substrate at a processing step subsequent to that shown by FIG. 10 and corresponding in sequence to that of FIG. 11, with the left portion of FIG. 13 being taken through line 13-13 in FIG. 11.

FIG. 15 is a view of the FIG. 12 substrate at a processing step subsequent to that shown by FIG. 12 and corresponding in sequence to that of FIG. 14.

FIG. 16 is a top view of the FIG. 11 substrate at a processing step subsequent to that of FIG. 11 and subsequent to that of FIGS. 14 and 15.

FIG. 17 is a view of the FIG. 14 substrate at a processing step subsequent to that shown by FIG. 14 and corresponding in sequence to that of FIG. 16, with the left portion of FIG. 17 being taken through line 17-17 in FIG. 16.

FIG. 18 is a view of the FIG. 15 substrate at a processing step subsequent to that shown by FIG. 15 and corresponding in sequence to that of FIG. 16, with the left portion of FIG. 18 being taken through line 18-18 in FIG. 16.

FIG. 19 is a top view of the FIG. 16 substrate at a processing step subsequent to that of FIG. 16.

FIG. 20 is a view of the FIG. 18 substrate at a processing step subsequent to that shown by FIG. 18 and corresponding in sequence to that of FIG. 19, with the left portion of FIG. 20 being taken through line 20-20 in FIG. 19.

FIG. 21 is a view of the FIG. 17 substrate at a processing step subsequent to that shown by FIG. 17 and subsequent to that shown by FIGS. 19 and 20.

FIG. 22 is a view of the FIG. 20 substrate at a processing step subsequent to that shown by FIG. 20 and corresponding in sequence to that of FIG. 21.

FIG. 25 is a top view of an alternate embodiment.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
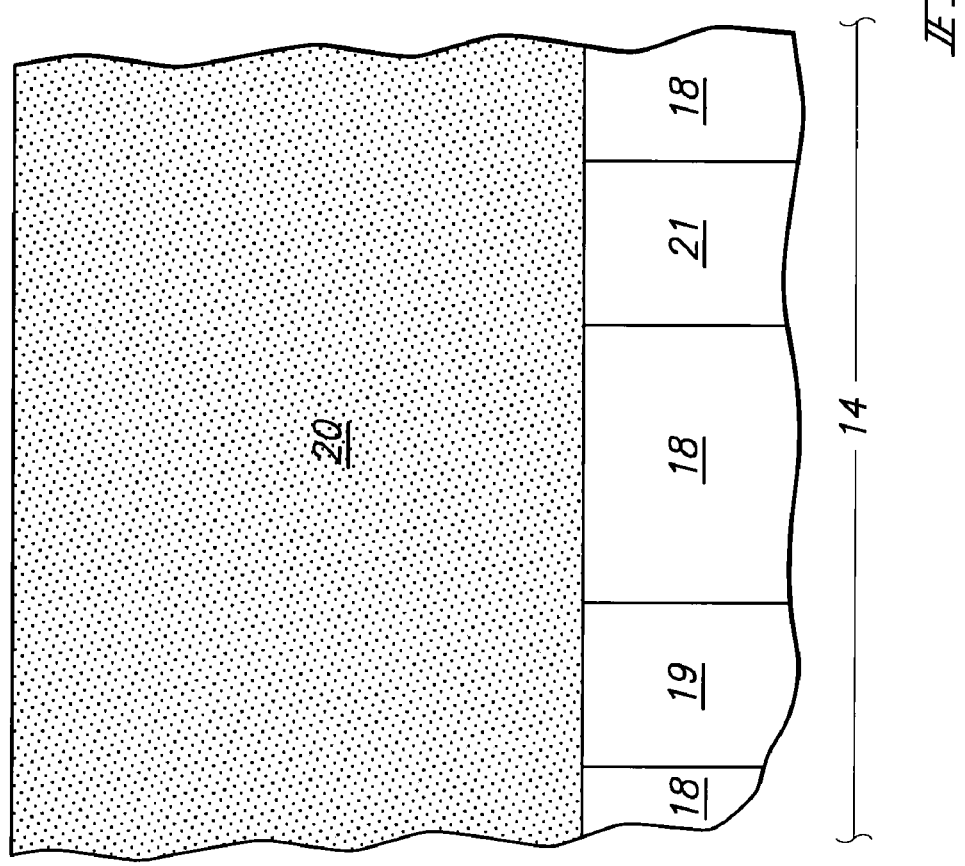
FIG. 1 is a fragmentary diagrammatic section of a semiconductor wafer fragment in process in accordance with an aspect of the invention.

Referring to FIG. 1, a semiconductor substrate in process in accordance with an aspect of the invention is indicated generally with reference to numeral 10. Such comprises a substrate which in one exemplary embodiment comprises a semiconductor substrate, for example comprised of bulk monocrystalline silicon or other material. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural, unless otherwise indicated.

The discussion proceeds in a preferred embodiment method of forming an array of capacitors, for example as might be utilized in DRAM or other memory circuitry constructions. Substrate fragment 10 can be considered as comprising a region 14 and a region 16. In but one implementation, region 14 in one preferred embodiment comprises a capacitor array area and region 16 comprises a circuitry area peripheral to capacitor array area 14. Further by way of example only, substrate fragment 10 is depicted as comprising an insulative layer 18 having a plurality of conductive contact plugs 19 and 21 formed therein for electrical connection with respect to capacitor electrodes of a plurality of capacitors, as will be apparent from the continuing discussion. Insulative material 18 would overlie other substrate material (not shown), for example bulk monocrystalline silicon, semiconductor-on-insulator circuitry or other substrate material whether existing or yet-to-be developed. Exemplary preferred insulative material 18 includes silicon dioxide doped with at least one of boron and phosphorus, for example borophosphosilicate glass (BPSG). Conductive plugs 19 and 21 will comprise one or more conductive materials, perhaps including for example conductively doped semiconductive material. Substrate 18/19/21 is exemplary only, and any conceivable substrate is contemplated whether existing or yet-to-be developed.

A first material 20 has been formed over substrate 18/19/21. An exemplary preferred material is BPSG, with an exemplary preferred thickness range being from 1,000 Angstroms to 20,000 Angstroms. Capacitor electrodes will be formed within material 20 as will be apparent from the continuing discussion, and accordingly material 20 might be considered as capacitor electrode-forming material. First material 20 might be electrically insulative, electrically conductive, or semiconductive, with electrically insulative being most preferred. Capacitor electrode-forming material 20 might comprise a single, homogenous layer as depicted in FIG. 1, might be non-homogenous (for example two or more layers of BPSG with different dopant levels), and further by way of example only might comprise a plurality of discrete layers. For example and by way of example only, FIG. 2 depicts an alternate embodiment substrate fragment 10a. Like numerals from the first described embodiment have been utilized where appropriate, with differences being indicated with the suffix "a" or with different numerals. FIG. 2 depicts capacitor electrode-forming material/first material 20a as comprising at least two layers 22 and 24. By way of example only, layer 22 might comprise an etch stop layer (i.e. silicon nitride, aluminum oxide, etc.) with layer 24 comprising BPSG.

Referring to FIGS. 3-5, a plurality of spaced masking blocks 25, 26, 27, 28, 29, 30, 31, 32 and 33 have been formed over first material 20. Such define respective capacitor electrode opening outlines 25b, 26b, 27b, 28b, 29b, 30b, 31b, 32b, and 33b. By way of example only, a preferred manner of forming the depicted masking blocks with their corresponding outlines is by photolithographic patterning and etch. Masking blocks 25-33 might be of the same or different composition from that of first material 20, with different compositions being more preferred. Where for example such are formed of the same composition, one exemplary manner of forming masking blocks 28 relative to underlying material 20 is by a timed etch of the first material through openings formed in a mask, for example through openings formed in a photomask. Further by way of example only, an etch stop layer might be received intermediate masking blocks 25-33 and underlying first material. For example and by way of example only, with respect to the FIG. 2 embodiment, layer 22 might be provided to constitute an etch stop layer provided intermediate masking blocks 25-33 and underlying first material 24 (not shown). The exemplary depicted array pattern of masking blocks 25-33 is exemplary only, with essentially any other existing or yet-to-be developed array pattern also being contemplated. In a depicted exemplary embodiment, and by way of example only, an exemplary spacing between immediately adjacent masking blocks in a row (i.e. between the right edge of masking block 28 and the left edge of masking block 29) is 500 Angstroms. An exemplary spacing between immediately adjacent masking blocks in a column (i.e. between the lower edge of masking block 26 and the upper edge of masking block 29 in FIG. 3) is 500 Angstroms. An exemplary analogous diagonal spacing between diagonally adjacent masking blocks (i.e. between blocks 31 and 29) is 750 Angstroms.

Figure 7:
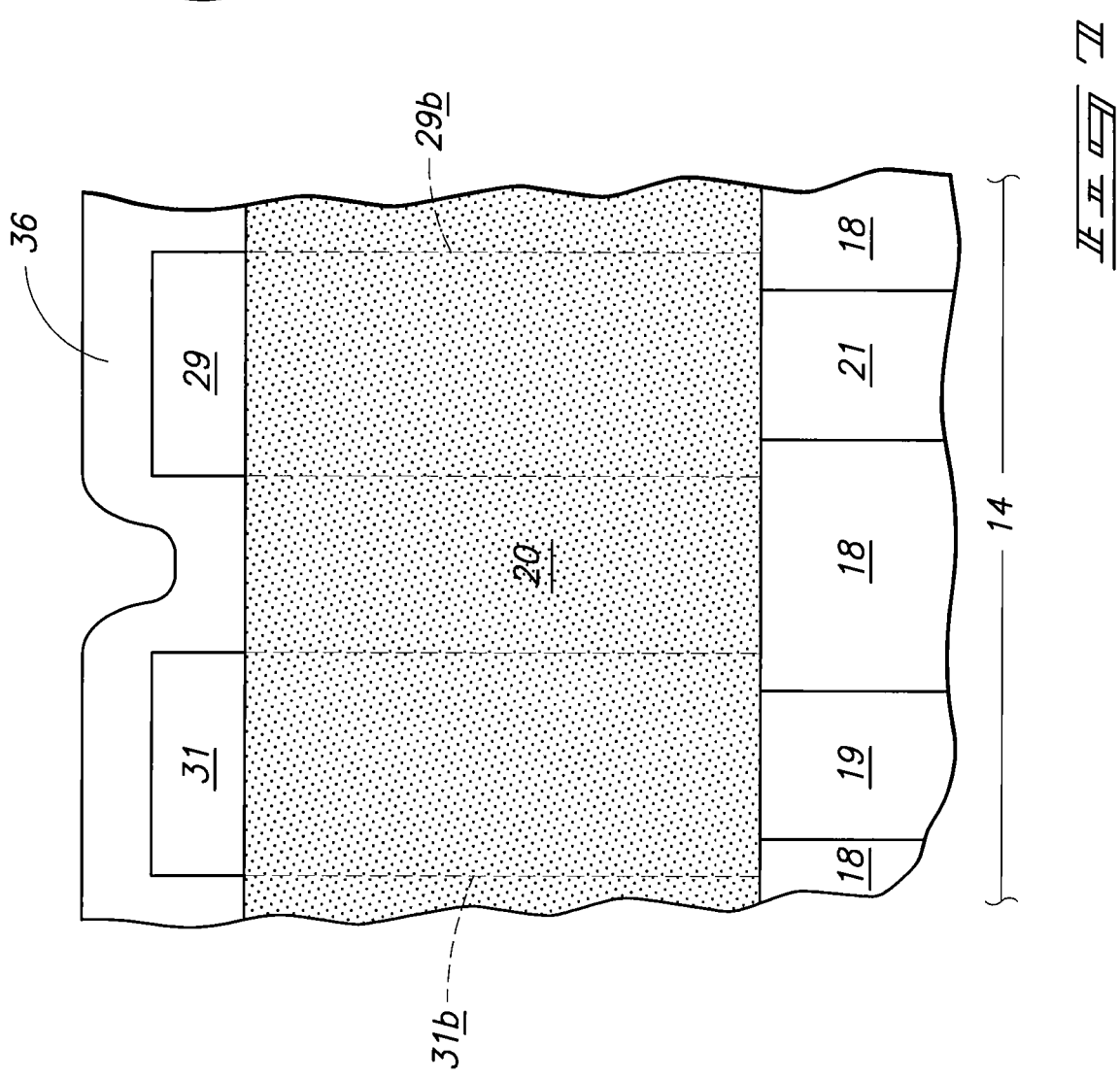
FIG. 7 is a view of the FIG. 5 substrate at a processing step subsequent to that shown by FIG. 5 and corresponding in sequence to that of FIG. 6.

Referring to FIGS. 6 and 7, a layer of second material 36 has been deposited over masking blocks 25-33 and over first material 20 received between masking blocks 25-33. In one aspect, second material 36 is of different composition from that of masking blocks 25-33. By way of example only where material 20 is BPSG and masking blocks 25-33 are BPSG or undoped silicon dioxide, exemplary preferred materials for layer 36 include silicon nitride, aluminum oxide, and hafnium oxide. Of course, other insulative, and even conductive and semiconductive, materials might be utilized for material 36. An exemplary semiconductive material comprises polysilicon. Exemplary electrically conductive materials include titanium nitride, tantalum nitride, and tungsten. An exemplary deposition thickness for layer 36 is from 250 Angstroms to 300 Angstroms.

Figure 8:
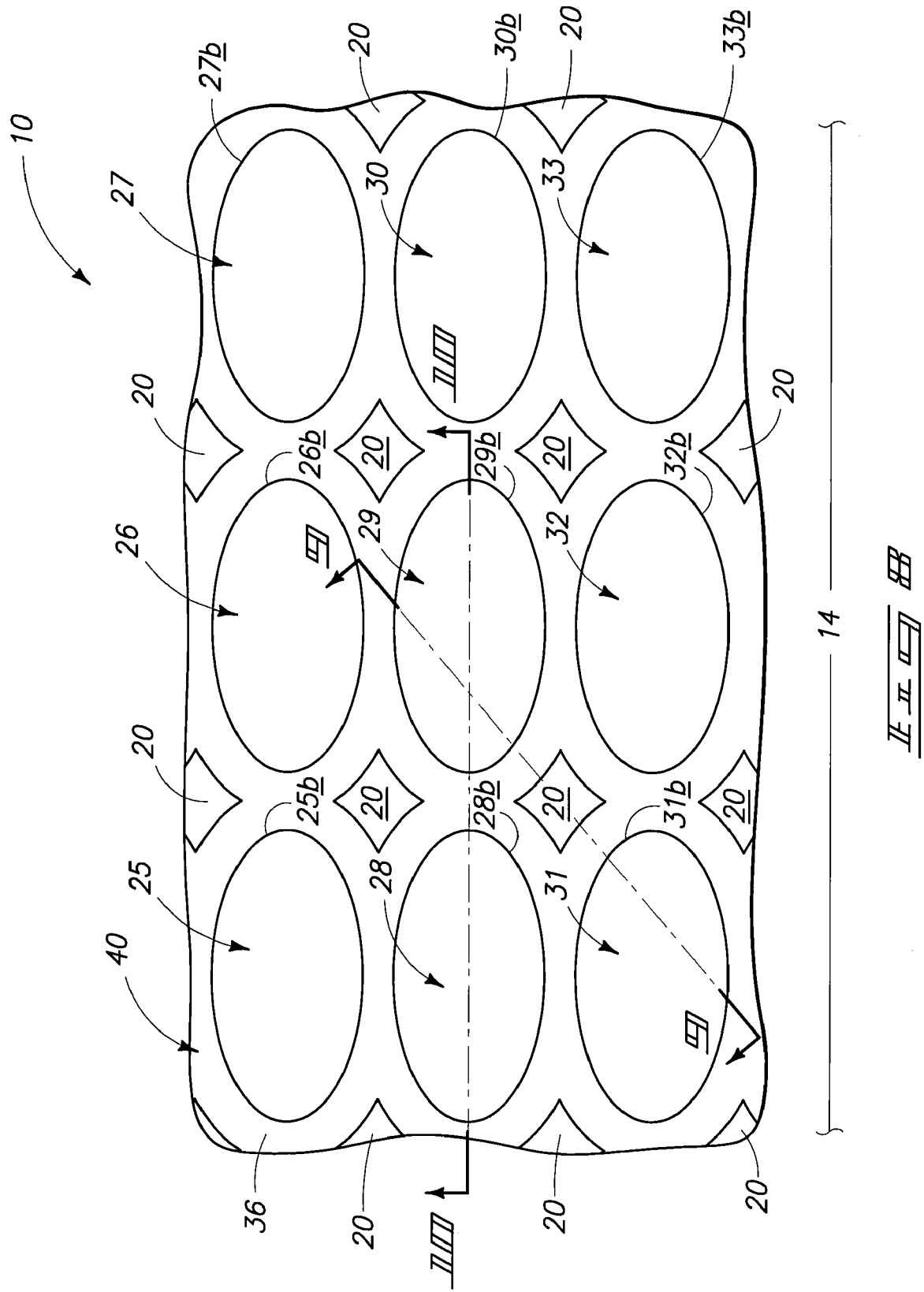
FIG. 8 is a top view of the FIG. 3 substrate at a processing step subsequent to that of FIG. 3 and subsequent to that of FIGS. 6 and 7.
Figure 9:
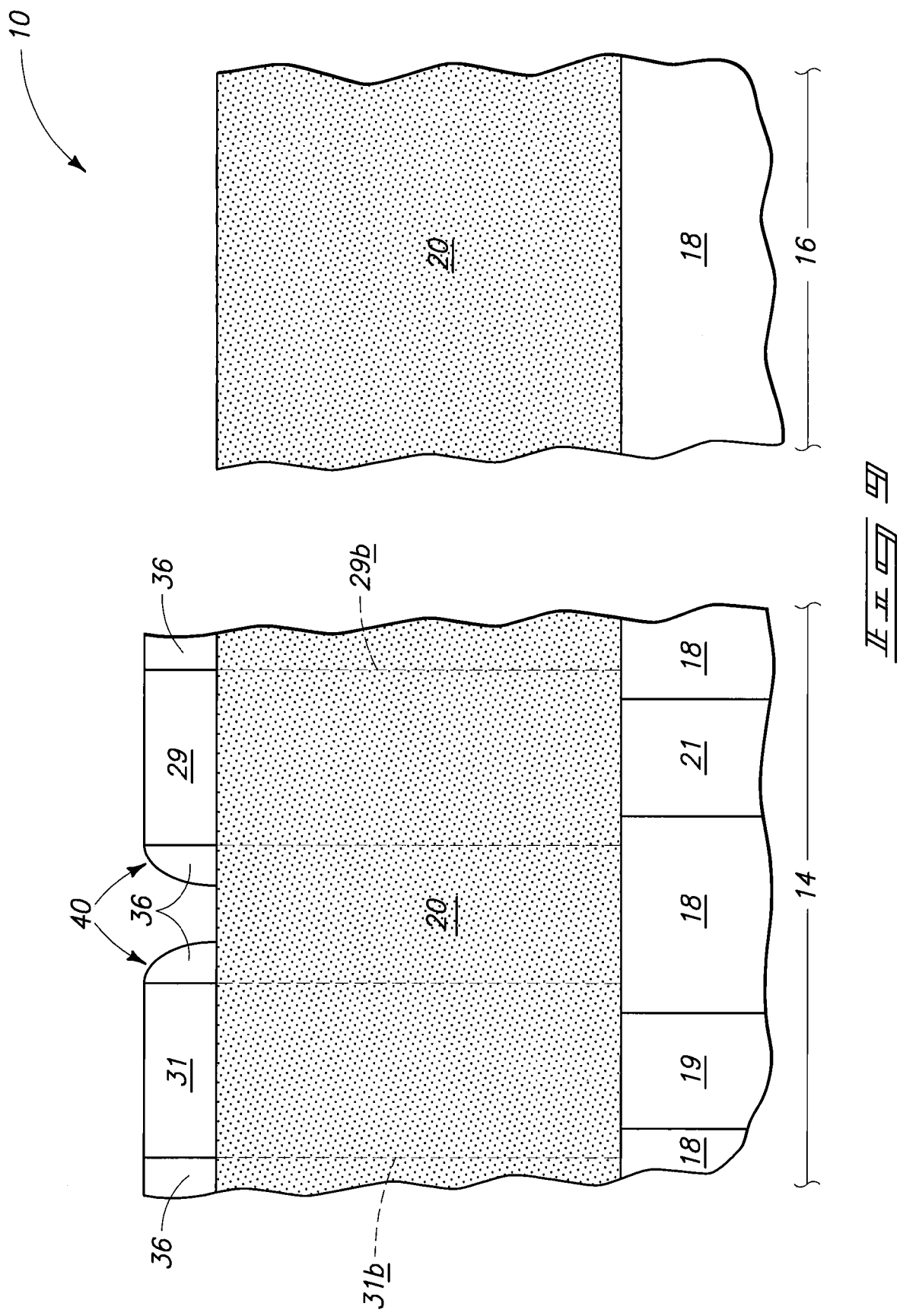
FIG. 9 is a view of the FIG. 7 substrate at a processing step subsequent to that shown by FIG. 7 and corresponding in sequence to that of FIG. 8, with the left portion of FIG. 9 being taken through line 9-9 in FIG. 8.
Figure 10:
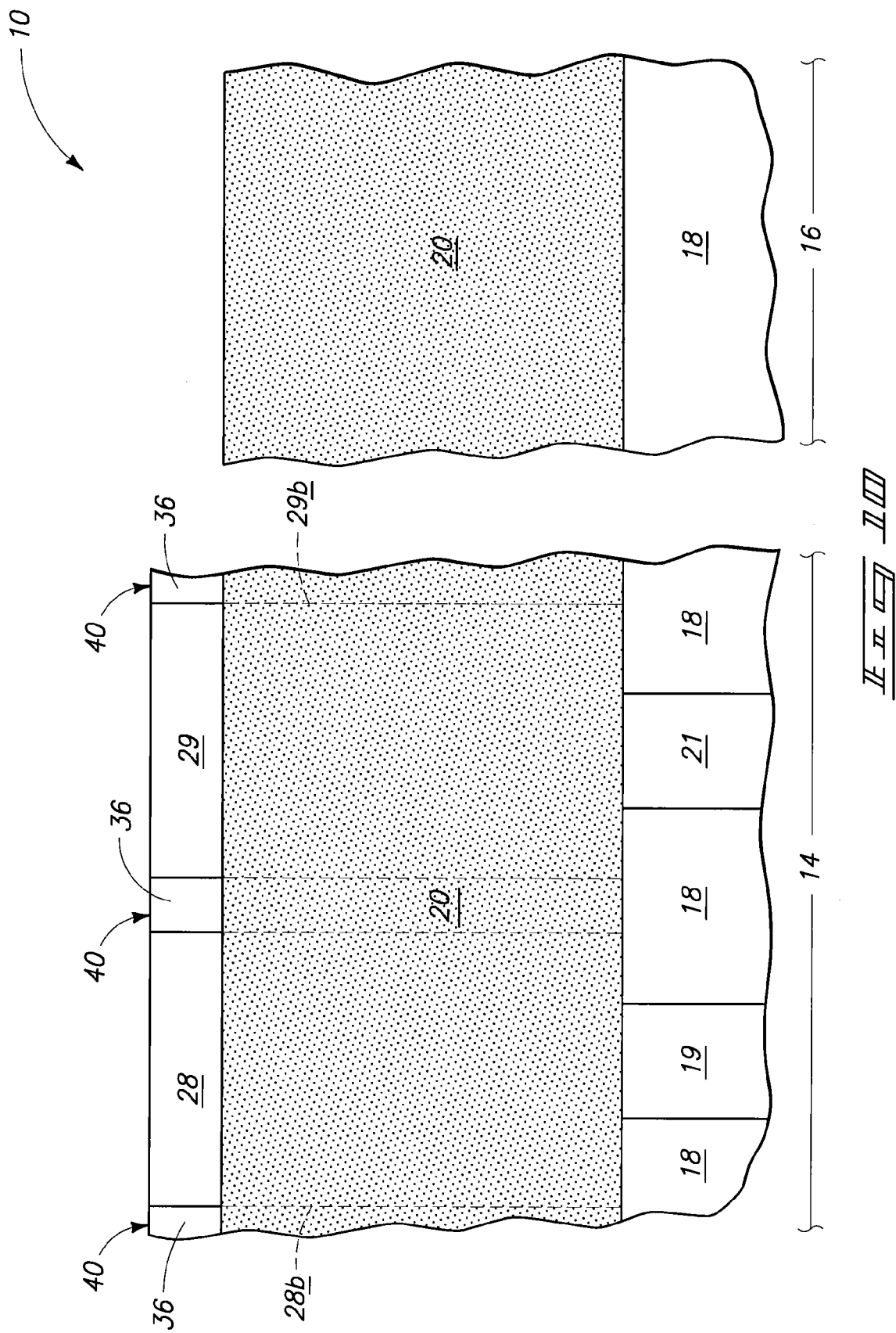
FIG. 10 is a view of the FIG. 6 substrate at a processing step subsequent to that shown by FIG. 6 and corresponding in sequence to that of FIG. 8, with the left portion of FIG. 10 being taken through line 10-10 in FIG. 8.

Referring to FIGS. 8-10, layer of second material 36 has been anisotropically etched effective to expose masking blocks 25-33 and form an interconnected retaining structure 40 against sidewalls of the depicted masking blocks 25-33. Further, interconnected retaining structure 40 exposes some of first material 20 received between the depicted masking blocks in the depicted exemplary embodiment. By way of example only, such exposed first material 20 is between diagonally adjacent masking blocks, although other position openings are of course contemplated and likely dependent upon the array patterning of the masking blocks. Further in the depicted preferred embodiment, retaining structure 40 directly contacts sidewalls of the depicted masking blocks. In the depicted and most preferred embodiment, retaining structure 40 is formed at least in part by etching layer of material 36 whereby such is not masked anywhere within capacitor array area 14 to form such retaining structure 40. Further in one exemplary preferred embodiment, structure 40 might be so formed without any of layer of material 36 being masked anywhere on the substrate to form such retaining structure. For example and by way of example only, FIGS. 9 and 10 depict no masking occurring within peripheral circuitry area 16 such that all material 36 is removed therefrom. Alternately of course, layer of material 36 as/when extending to be received over peripheral area 16 might be at least partially masked in such peripheral area during the anisotropic etching (not shown) such that at least some of it remains after such etching.

Figure 12:
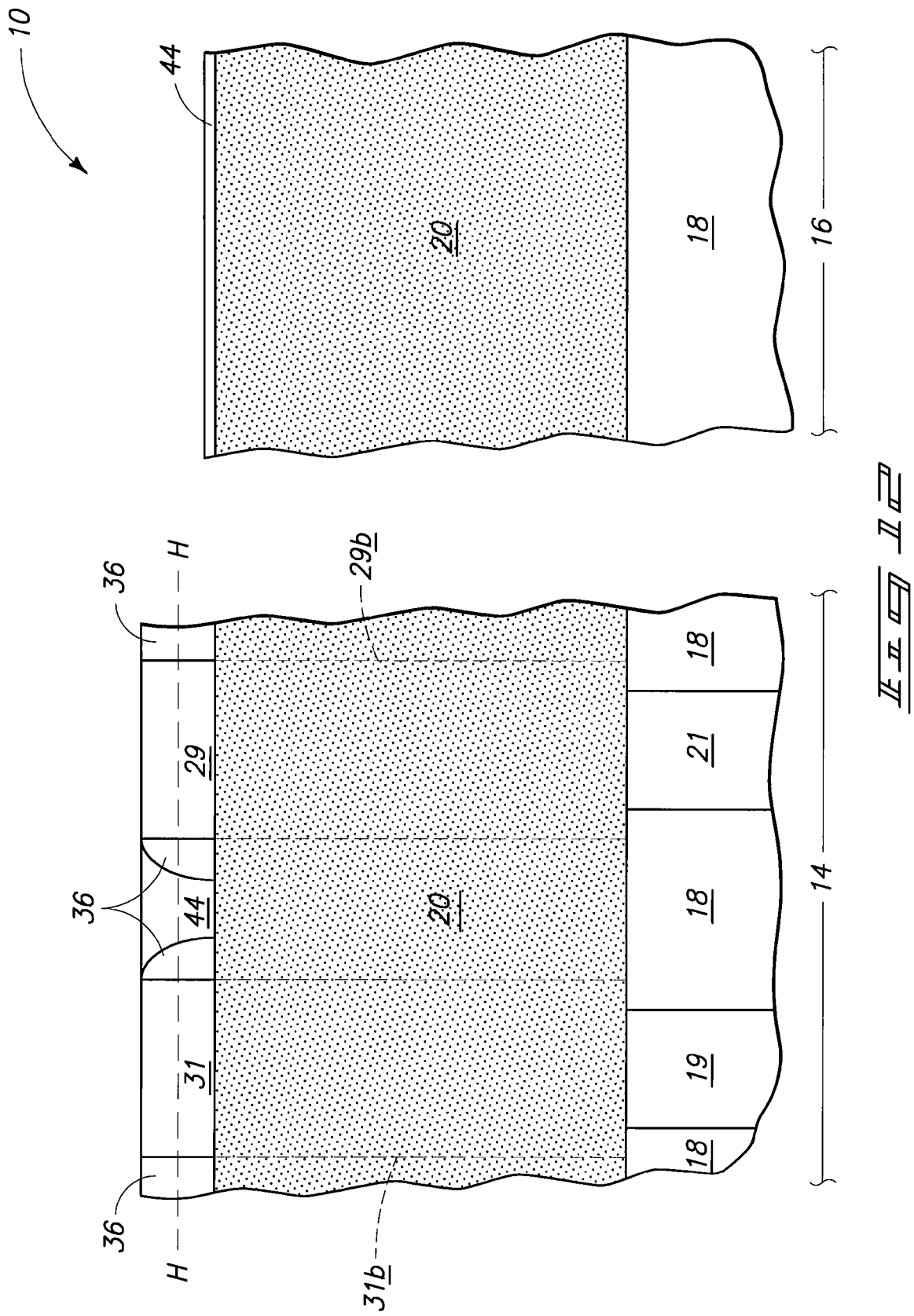
FIG. 12 is a view of the FIG. 9 substrate at a processing step subsequent to that shown by FIG. 9 and corresponding in sequence to that of FIG. 11, with the left portion of FIG. 12 being taken through line 12-12 in FIG. 11.
Figure 11:
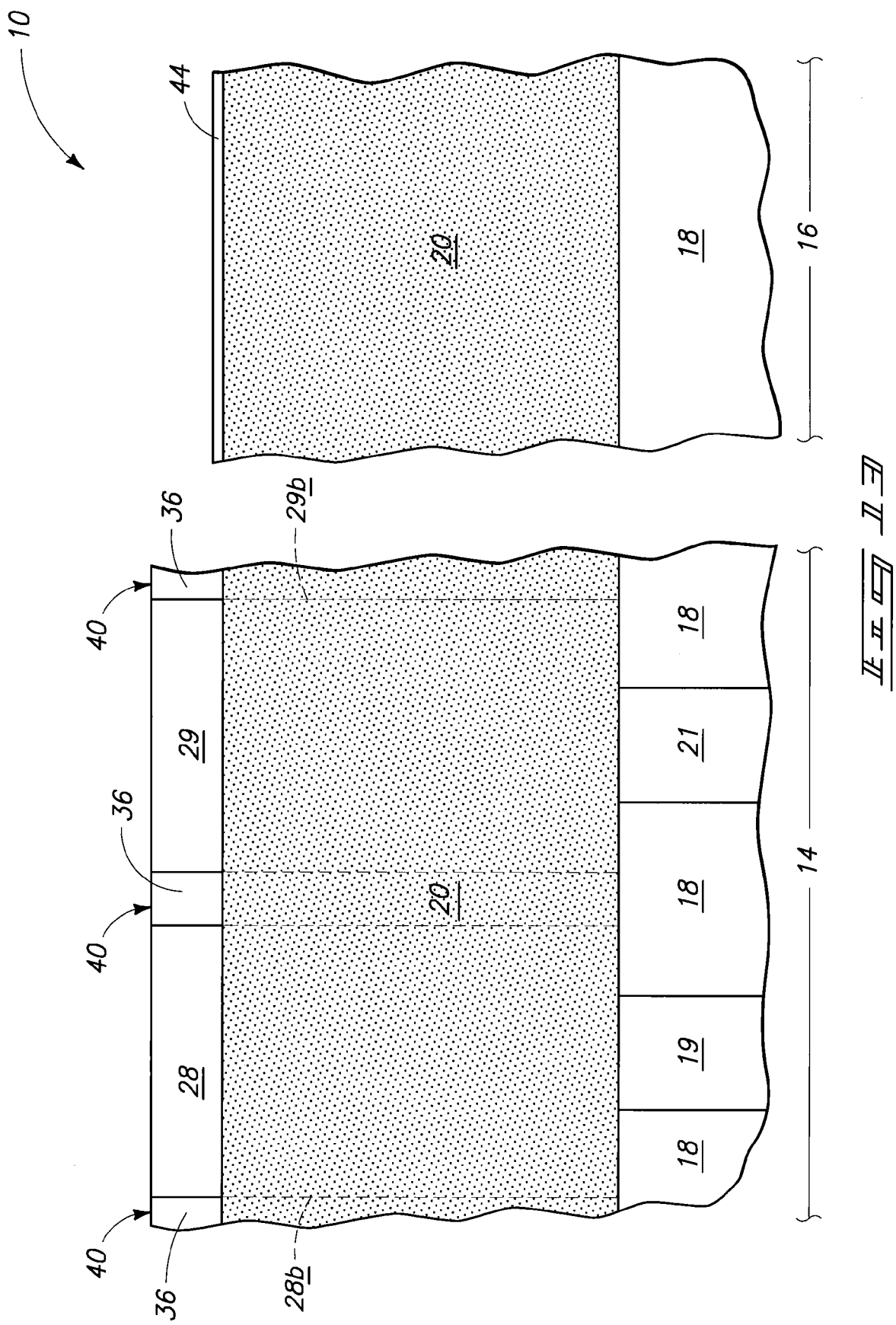
FIG. 11 is a top view of the FIG. 8 substrate at a processing step subsequent to that of FIG. 8.

Referring to FIGS. 11-13, exposed first material 20 received between masking blocks 25-33 has been masked with a third material 44. In one aspect, third material 44 is of different composition from that of first material 20, from that of masking blocks 25-33, and from that of second material 36. Where material 20 is BPSG, where masking blocks 25-33 comprise doped or undoped, silicon dioxide, and where layer of material 36 comprises silicon nitride, an exemplary material 44 is polysilicon. Regardless, one exemplary preferred technique for forming the FIGS. 11-13 construction is by deposition of material 44 followed by chemical-mechanical polishing of it effective to expose masking blocks 25-33. FIGS. 12 and 13 depict some remnant material 44 remaining within peripheral circuitry area 16, although of course material 44 might alternately be completely removed within peripheral area 16 at this point of the preferred processing. Further in one exemplary implementation, at least one of materials 25-33, material 36 and 44 comprises amorphous carbon, and in another implementation comprises polysilicon. Further of course in one aspect, at least one of material 25-33, material 36, and material 44 comprises amorphous carbon and at least another one of such materials comprises polysilicon.

Figure 14:
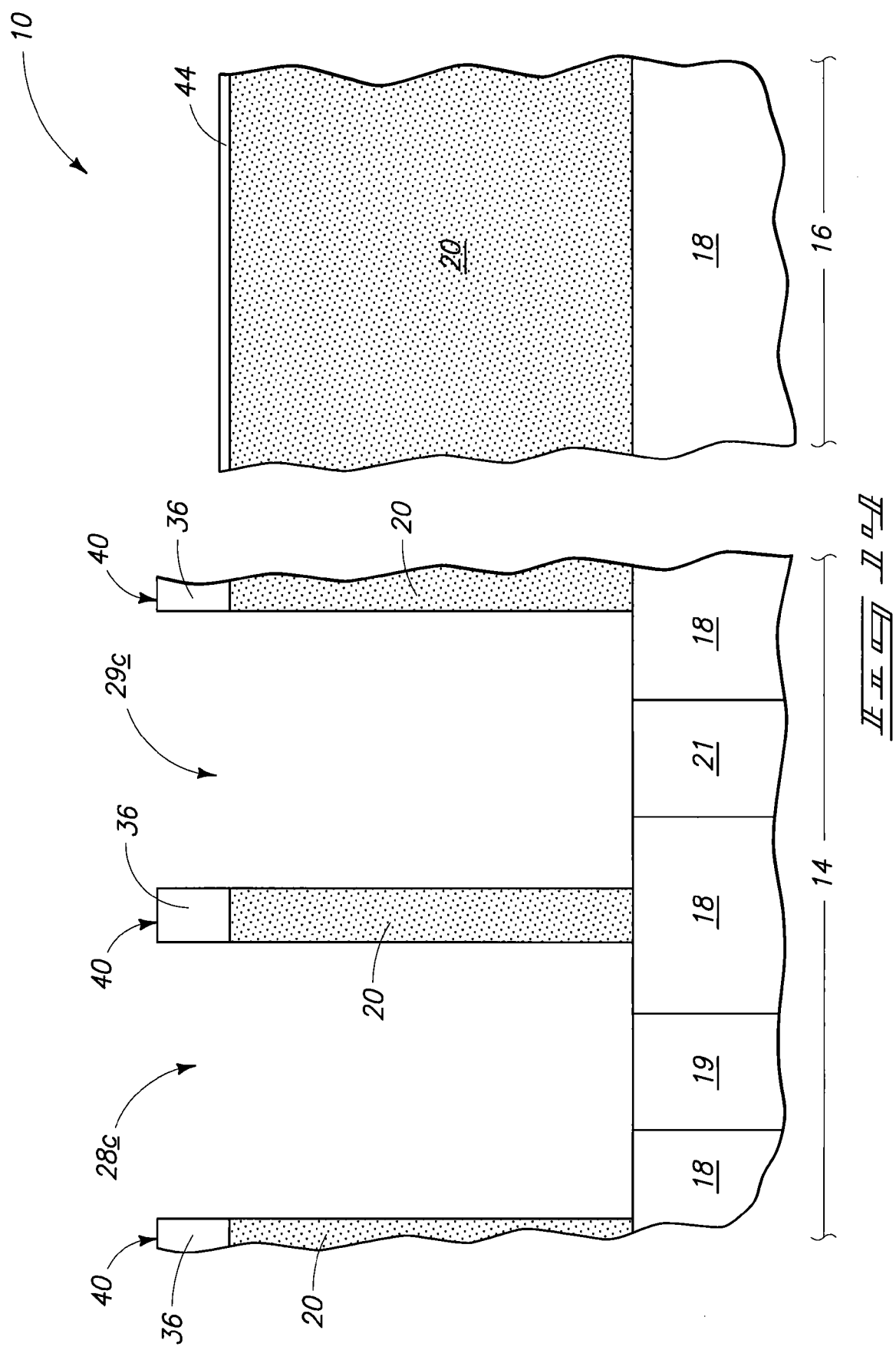
FIG. 14 is a view of the FIG. 13 substrate at a processing step subsequent to that shown by FIG. 13.

Referring to FIGS. 14 and 15, masking blocks 25-33 have been etched followed by etching (anisotropic) of first material 20 thereunder substantially selectively relative to second material 36 and third material 44 effective to form capacitor electrode openings 25c, 26c, 27c, 28c, 29c, 30c, 31c, 32c, and 33c. (Openings 25c, 26c, 27c, 30c, 32c and 33c are not shown in FIGS. 14 and 15, but do appear and are so designated in subsequent figures.) In the context of this document, a substantially selective etch requires a removal rate of the removed material relative to the stated other material(s) at a removal ratio of at least 15:1. In the depicted example where third material 44 remains masking material 20 within peripheral circuitry area 16, material 20 remains within such peripheral area. If no masking material 44 were received over material 20 in such area, all such material 20 in the peripheral circuitry area would likely be removed at this point of processing.

Referring to FIGS. 16-18, individual capacitor electrodes 25d, 26d, 27d, 28d, 29d, 30d, 31d, 32d, and 33d have been formed within individual of the respective capacitor electrode openings and against interconnected retaining structure 40. By way of example only, an exemplary preferred manner of forming the same is by deposition of a titanium nitride layer to a suitable thickness, followed by chemical-mechanical polishing thereof. In the depicted preferred and exemplary embodiments, the layer from which the capacitor electrodes are formed is deposited to less than completely fill the respective capacitor electrode openings such that the resultant individual of the capacitor electrodes comprises a container shape. Of course, other electrode shapes are contemplated, including by way of example only completely plugging of the capacitor electrode openings with conductive material for formation of capacitor electrodes.

Referring to FIGS. 19 and 20, third material 44 (not shown) has been etched substantially selectively relative to second material 36 and substantially selectively relative to the capacitor electrodes 25d-33d effective to expose first material 20 beneath the etched third material.

Referring to FIGS. 21 and 22, after such etching of the third material 44, at least some of the exposed first material 20 has been etched substantially selectively relative to capacitor electrodes 25d-33d and substantially selectively relative to second material 36 effective to expose outer lateral sidewalls of capacitor electrodes 25d-33d, and to leave at least some of second material 36 of the interconnected retaining structure 40 at least in part supporting capacitor electrodes 25d-33d. In the depicted and preferred embodiment, such etching has been of substantially all of first material 20 such that substantially all of the outer lateral sidewalls of the capacitor electrodes have been exposed.

One implementation of the invention contemplates at least some etching of material 36 of retaining structure 40 prior to deposition of third material 44. Such is shown by way of example only with respect to FIG. 25 in connection with an alternate embodiment substrate fragment 10g. Like numerals from the first described embodiments have been utilized as appropriate, with differences being indicated with the suffix "g". FIG. 25 depicts some etching having occurred relative to the retaining structure such that a retaining structure 40g results by a degree of etching which is effective to open up the spaces of exposed material 20. For example, the depicted dash lines show the initial openings as depicted in the first embodiment, with the solid line outlines thereabout depicting such widening resulting from a suitable exemplary facet etch or a suitable exemplary wet etch of material 36. By way of example only where, for example, material 36g comprises silicon nitride, an exemplary wet etching chemistry for producing the FIG. 25 structure includes phosphoric acid. An exemplary facet etch technique would include argon plasma at from 100 W to 1000 W RF power, and from 25° C. to 100° C.

Figure 23:
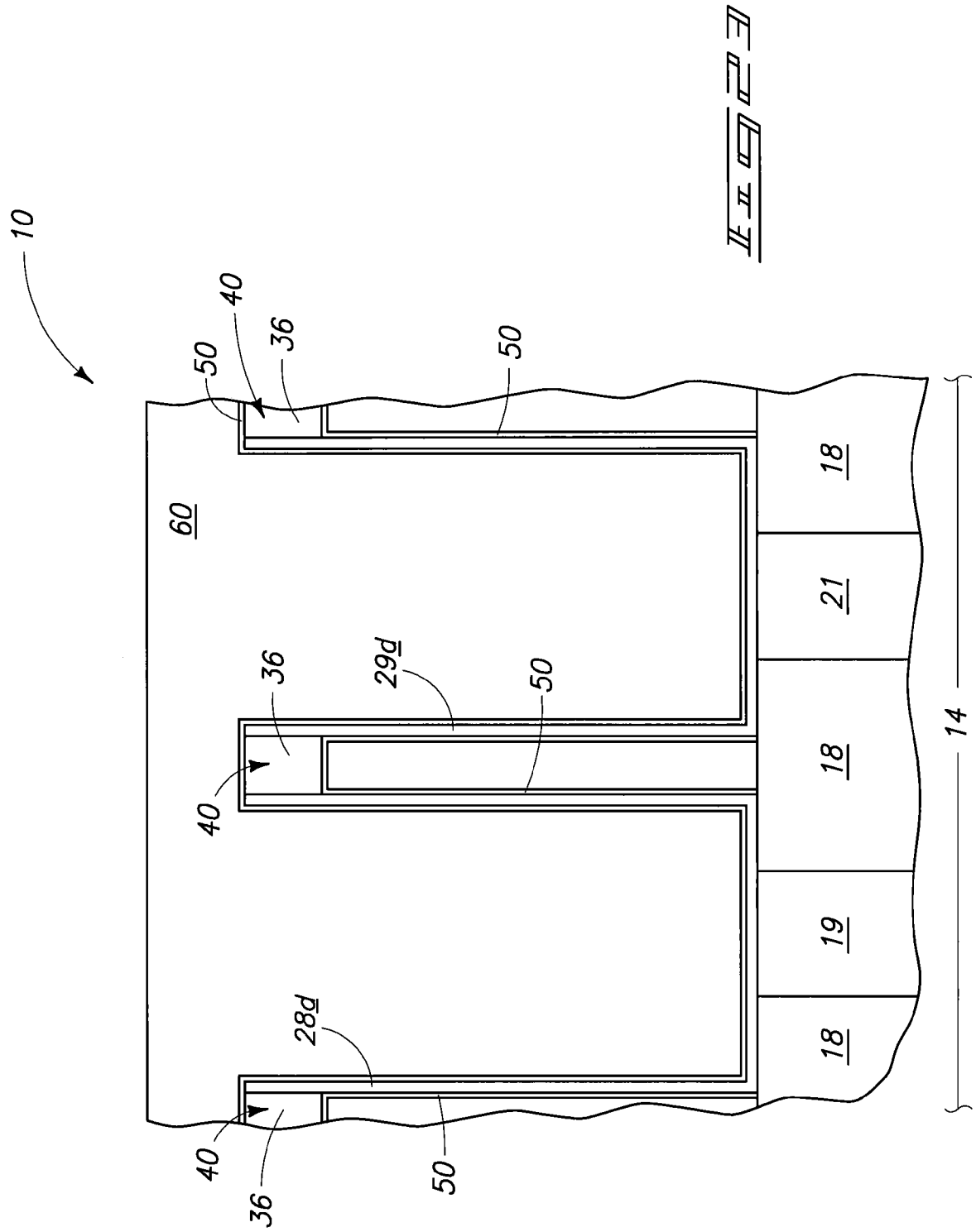
FIG. 23 is a view of the left portion of the FIG. 21 substrate at a processing step subsequent to that shown by FIG. 21.
Figure 24:
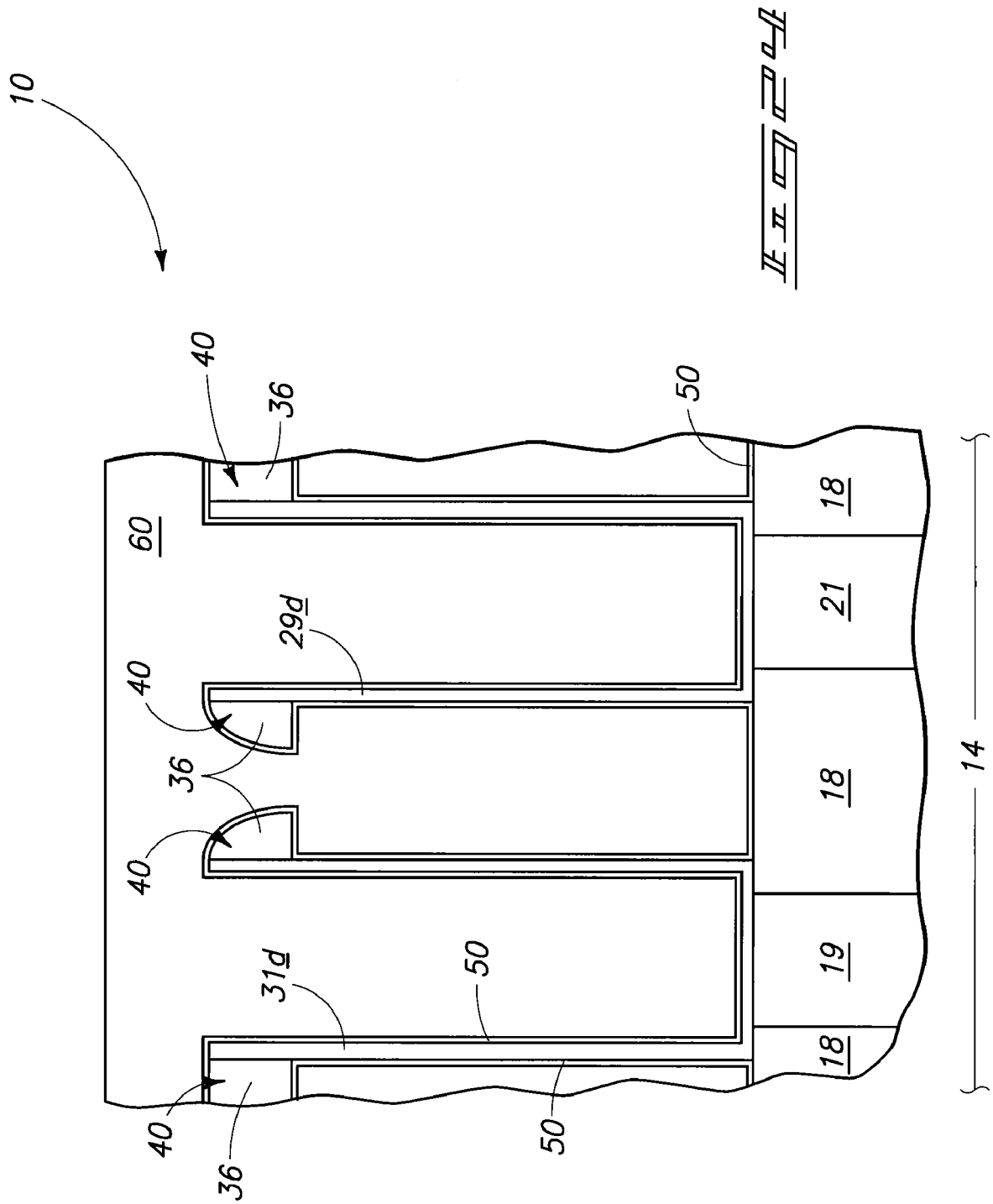
FIG. 24 is a view of the left portion of the FIG. 22 substrate at a processing step subsequent to that shown by FIG. 22 and corresponding in sequence to that of FIG. 23.

Referring to FIGS. 23 and 24, capacitor dielectric material 50 and capacitor electrode material 60 have been deposited at least below retaining structure 40 over at least some of the outer lateral sidewalls of the capacitor electrodes as-shown. Any suitable existing or yet-to-be developed materials are of course contemplated. In the depicted exemplary embodiment, capacitor electrode material 60 is shown as constituting a common capacitor electrode among a plurality of capacitors. Of course alternately by way of example only, such might be patterned or otherwise formed to constitute a separate capacitor electrode for each capacitor or for a group of capacitors. In the depicted preferred embodiment, retaining structure 40 remains as part of a finished integrated circuitry construction incorporating a plurality of capacitors.

In one aspect, an implementation of the invention can be considered as a method of forming a plurality of capacitors which includes forming different composition first, second, and third materials over a capacitor electrode-forming material. By way of example only, material of masking blocks 25-33 constitutes an exemplary first material, material 36 constitutes an exemplary second material, and material 44 constitutes an exemplary third material, with all of such being received over an exemplary capacitor electrode-forming material 20. First, second and third materials are received at least in part at some common elevation over the capacitor electrode-forming material. By way of example only, FIG. 12 depicts an exemplary such elevation "H". The second material comprises an anisotropically etched retaining structure.

Such first material is etched substantially selectively relative to the second and third materials followed by etching of the capacitor electrode-forming material substantially selectively relative to the second and third materials effective to form a plurality of capacitor electrode openings. By way of example only, the above described processing relative to the figures is but one exemplary technique. Individual capacitor electrodes are formed within individual of the capacitor electrode openings.

Thereafter, the third material is etched substantially selectively relative to the second material and substantially selectively relative to the capacitor electrodes effective to expose capacitor electrode-forming material underlying the third material which was/is being etched. This is followed by etching the capacitor electrode-forming material substantially selectively relative to the second material and substantially selectively relative to the capacitor electrodes effective to expose outer lateral sidewalls of the capacitor electrodes. Only some or all of the capacitor electrode-forming material might be etched. Regardless, such etching is also effective to leave at least some of the retaining structure at least in part supporting the plurality of capacitor electrodes. The plurality of capacitor electrodes is incorporated into a plurality of capacitors.

One implementation of an aspect of the invention includes a method of forming a plurality of capacitors whereby a plurality of capacitor electrodes is provided within a capacitor array area over a substrate, and whereby the capacitor electrodes comprise outer lateral sidewalls. Such a method includes supporting the plurality of capacitor electrodes at least in part with a retaining structure which engages the outer lateral sidewalls. The retaining structure is formed at least in part by etching a layer of material which is not masked anywhere within the capacitor array area to form such retaining structure. The above described preferred processing of providing a plurality of capacitor electrodes and supporting the same with a retaining structure as described above is but only one exemplary embodiment of this implementation as just so stated. The plurality of capacitor electrodes is incorporated into a plurality of capacitors, for example and by way of example only as described above. In the above described exemplary embodiments, such etching to form the retaining structure occurs prior to formation of the plurality of capacitor electrodes. However, an aspect of the invention contemplates etching to form the retaining structure after formation of the plurality of capacitor electrodes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a plurality of capacitors, comprising:
   providing a plurality of capacitor electrodes within a capacitor array area over a substrate, the capacitor electrodes comprising outer lateral sidewalls, individual of the capacitor electrodes comprising a container shape;
   forming a retaining structure which engages the outer lateral sidewalls of the capacitor electrodes, the retaining structure being formed at least in part by etching a layer of insulative material which is not masked anywhere within the capacitor array area to form said retaining structure; and further comprising after forming the retaining structure, etching the retaining structure to reduce its size; the etched retaining structure at least in part supporting the plurality of capacitor electrodes; and
   incorporating the plurality of capacitor electrodes into a plurality of capacitors, the retaining structure remaining as part of a finished integrated circuitry construction incorporating the plurality of capacitors.

2. The method of claim 1 wherein said etching of the layer of insulative material occurs prior to formation of the plurality of capacitor electrodes.

3. The method of claim 1 wherein said etching of the layer of insulative material occurs after formation of the plurality of capacitor electrodes.

4. The method of claim 1 comprising a circuitry area peripheral to the capacitor array area, said layer of insulative material extending to over the peripheral area during said etching of the layer of material and being at least partially masked in said peripheral area during said etching of the layer of material.

5. The method of claim 1 wherein said layer of insulative material is not masked anywhere on the substrate during said etching of the layer of material.

6. A method of forming a plurality of capacitors, comprising:
    forming different composition first, second and third materials over a capacitor electrode-forming material; said first, second and third materials being received at least in part at some common elevation over the capacitor electrode-forming material; the second material being electrically insulative and comprising an anisotropically etched retaining structure;
    etching the first material substantially selectively relative to the second and third materials followed by etching the capacitor electrode-forming material substantially selectively relative to the second and third materials effective to form a plurality of capacitor electrode openings;
    forming individual capacitor electrodes within individual of the capacitor electrode openings, individual of the capacitor electrodes comprising a container shape;
    etching the third material substantially selectively relative to the second material and substantially selectively relative to the capacitor electrodes effective to expose capacitor electrode-forming material underlying said third material being etched, followed by etching said capacitor electrode-forming material substantially selectively relative to the second material and substantially selectively relative to the capacitor electrodes effective to expose outer lateral sidewalls of the capacitor electrodes and leave at least some of the retaining structure supporting the capacitor electrodes; and
    incorporating the plurality of capacitor electrodes into a plurality of capacitors, the retaining structure remaining as part of a finished integrated circuitry construction incorporating the plurality of capacitors.

7. The method of claim 6 wherein the first material is different in composition from that of the capacitor electrode-forming material.

8. The method of claim 6 wherein the first material is of the same composition as that of the capacitor electrode-forming material.

9. The method of claim 6 wherein the capacitor electrode-forming material comprises at least two layers, one of the two layers comprising an etch stop layer received proximate the first, second, and third materials.

10. The method of claim 6 wherein the first material is formed prior the second material and the second material is formed prior to the third material, and further comprising facet etching the retaining structure prior to forming the third material.

11. The method of claim 6 wherein the first material is formed prior the second material and the second material is formed prior to the third material, and further comprising wet etching the retaining structure prior to forming the third material.

12. A method of forming a plurality of capacitors, comprising:
    forming a plurality of spaced masking blocks over a capacitor electrode-forming material, the masking blocks defining respective capacitor electrode opening outlines;
    forming an interconnected insulative retaining structure over the capacitor electrode-forming material and against sidewalls of the masking blocks;
    etching the masking blocks and then the capacitor electrode-forming material thereunder to form capacitor electrode openings within the capacitor electrode-forming material;
    forming individual container-shaped capacitor electrodes within individual of the capacitor electrode openings and against the interconnected retaining structure, the capacitor electrodes comprising outer lateral sidewalls;
    etching at least some of the capacitor electrode-forming material to expose at least some of said outer lateral sidewalls of the capacitor electrodes; and
    after exposing outer lateral sidewalls of the capacitor electrodes, depositing capacitor dielectric material and capacitor electrode material over the retaining structure over at least some of said outer lateral sidewalls.

13. The method of claim 12 wherein the masking blocks are of a different composition from that of the capacitor electrode-forming material.

14. The method of claim 12 wherein the masking blocks are of the same composition as that of the capacitor electrode-forming material.

15. A method of forming a plurality of capacitors, comprising:
    providing a plurality of capacitor electrodes within a capacitor array area over a substrate, the capacitor electrodes comprising outer lateral sidewalls;
    supporting the plurality of capacitor electrodes at least in part with a retaining structure which engages the outer lateral sidewalls, the retaining structure being formed prior to forming the plurality of capacitor electrodes, the retaining structure at least prior to forming the plurality of capacitor electrodes having a plurality of openings formed there-through, individual of the openings being received between diagonally adjacent of the capacitor electrodes to be formed; and
    incorporating the plurality of capacitor electrodes into a plurality of capacitors.

16. A method of forming a plurality of capacitors, comprising:
    providing a plurality of capacitor electrodes within a capacitor array area over a substrate, the capacitor electrodes comprising outer lateral sidewalls;
    supporting the plurality of capacitor electrodes at least in part with a retaining structure which engages the outer lateral sidewalls, the retaining structure being formed prior to forming the plurality of capacitor electrodes, the retaining structure at least prior to forming the plurality of capacitor electrodes having a plurality of openings formed there-through, forming of the retaining structure comprising enlarging the openings after their initial formation; and
    incorporating the plurality of capacitor electrodes into a plurality of capacitors.

* * * * *